(12) United States Patent
Kim et al.

(10) Patent No.: US 8,008,722 B2
(45) Date of Patent: Aug. 30, 2011

(54) MULTI-LAYER NONVOLATILE MEMORY DEVICES HAVING VERTICAL CHARGE STORAGE REGIONS

(75) Inventors: JinGyun Kim, Yongin-si (KR); Seungmok Shin, Yongin-si (KR); Chae Soodoo, Seongnam-si (KR); Seung-Yup Lee, Seongnam-si (KR)

(73) Assignee: Samsung Electronics Co., Ltd. (KR)

( * ) Notice: Subject to any disclaimer, the term of this patent is extended or adjusted under 35 U.S.C. 154(b) by 68 days.

(21) Appl. No.: 12/641,666

(22) Filed: Dec. 18, 2009

(65) Prior Publication Data
US 2010/0155810 A1    Jun. 24, 2010

(30) Foreign Application Priority Data
Dec. 24, 2008 (KR) .................. 10-2008-0133714

(51) Int. Cl.
*H01L 27/01* (2006.01)
*H01L 21/4763* (2006.01)
(52) U.S. Cl. ........................ 257/347; 438/596
(58) Field of Classification Search .......... 257/394–397, 257/347, 331, E29.287; 438/588, 596
See application file for complete search history.

(56) References Cited

U.S. PATENT DOCUMENTS

| | | | |
|---|---|---|---|
| 5,308,778 A | 5/1994 | Fitch et al. | |
| 5,308,782 A | 5/1994 | Masure et al. | |
| 5,480,820 A | 1/1996 | Roth et al. | |
| 5,583,360 A | 12/1996 | Roth et al. | |
| 7,271,444 B2 * | 9/2007 | Furukawa et al. | ............ 257/347 |
| 2005/0127466 A1 | 6/2005 | Furukawa et al. | |

FOREIGN PATENT DOCUMENTS

| | | |
|---|---|---|
| CN | 1627487 | 6/2005 |
| JP | 06-013623 | 1/1994 |
| JP | 06-069441 | 3/1994 |
| JP | 2005-175485 | 6/2005 |
| KR | 1020050058185 A | 6/2005 |

* cited by examiner

*Primary Examiner* — Calvin Lee
(74) *Attorney, Agent, or Firm* — Myers Bigel Sibley & Sajovec, P.A.

(57) ABSTRACT

Some embodiments of the present invention provide nonvolatile memory devices including a plurality of intergate insulating patterns and a plurality of cell gate patterns that are alternately and vertically stacked on a substrate, an active pattern disposed on the substrate, the active pattern extending upwardly along sidewalls of the intergate insulating patterns and the cell gate patterns, a plurality of charge storage patterns disposed between the plurality of cell gate patterns and the active pattern, respectively, the plurality of the charge storage patterns being separated from each other, tunnel insulating patterns disposed between the plurality of cell gate patterns and the active pattern, respectively, and the tunnel insulating patterns extending to be directly connected to each other and a plurality of blocking insulating patterns disposed between the plurality of cell gate patterns and the plurality of charge storage patterns, respectively. A sidewall of the cell gate pattern may be recessed laterally so that an undercut region is defined and the charge storage pattern is disposed in the undercut region.

10 Claims, 28 Drawing Sheets

MULTI-LAYER NONVOLATILE MEMORY DEVICES HAVING VERTICAL CHARGE STORAGE REGIONS

REFERENCE TO PRIORITY APPLICATION

This application claims priority to Korean Patent Application No. 10-2008-0133714, filed Dec. 24, 2008, the contents of which is hereby incorporated herein by reference.

FIELD OF THE INVENTION

The present invention relates to semiconductor memory devices and, more particularly, to nonvolatile memory devices.

BACKGROUND

Semiconductor memory devices may be classified into volatile memory devices and nonvolatile memory devices. Volatile memory devices lose their stored data when their power supplies are interrupted. Examples of volatile memory devices are dynamic random access memory (DRAM) devices and static random access memory (SRAM) devices. Nonvolatile memory devices can maintain their stored data even when their power supplies are interrupted. Examples of nonvolatile memory devices are erasable programmable read only memory (EPROM) devices, electrically erasable programmable read only memory (EEPROM) devices and flash memory devices.

As the electronics industry and the semiconductor industry advance, the desire for even greater integration of nonvolatile memory devices is increasing. For example, as more capable portable electronic devices, such as laptop computers, cell phones, digital cameras and MP3 players, are developed, the demand for nonvolatile memory devices capable of storing more data are increasing. Accordingly, the desire for more highly integrated nonvolatile memory devices is increasing.

A common way of achieving greater integration of nonvolatile memory devices is to decrease a minimum line width of fine patterns in the device. Generally, more memory cells can be integrated in a limited area by decreasing the minimum line width of fine patterns. However, the ability to decrease minimum line width is approaching a limit using conventional technologies. For example, a minimum line width that conventional photolithography processes can define appears to be approaching a limit such that, if line width is further decreased, the accuracy of fine patterns may deteriorate, resulting in degradation of reliability.

SUMMARY

Some embodiments of the present invention provide nonvolatile memory devices including a plurality of intergate insulating patterns and a plurality of cell gate patterns that are alternately and vertically stacked on a substrate, an active pattern disposed on the substrate, the active pattern extending upwardly along sidewalls of the intergate insulating patterns and the cell gate patterns, a plurality of charge storage patterns disposed between the plurality of cell gate patterns and the active pattern, respectively, the plurality of the charge storage patterns being separated from each other, tunnel insulating patterns disposed between the plurality of cell gate patterns and the active pattern, respectively, and the tunnel insulating patterns extending to be directly connected to each other and a plurality of blocking insulating patterns disposed between the plurality of cell gate patterns and the plurality of charge storage patterns, respectively. A sidewall of the cell gate pattern may be recessed laterally so that an undercut region is defined and the charge storage pattern is disposed in the undercut region.

In some embodiments, the tunnel insulating pattern is disposed in the undercut region, and the extended portion of the tunnel insulating pattern is disposed between a sidewall of the intergate insulating pattern and the active pattern. The active pattern may include a protrusion extending in the undercut region. The blocking insulating patterns may be separated from each other.

In further embodiments, the memory devices further include a first select gate pattern disposed between the substrate and a lowermost cell gate pattern among the cell gate patterns, a first gate insulating layer disposed between the first select gate pattern and the active pattern, a second select gate pattern disposed on an uppermost cell gate pattern among the cell gate patterns and extending in a first direction, a second gate insulating layer disposed between the second select gate pattern and the active pattern and a bit line disposed on a top surface of the second select gate pattern and extending a second direction perpendicular to the first direction. A well region may be disposed in the substrate and doped with dopants of a first conductivity type, a common source region may be disposed in the well region and doped with dopants of a second conductivity type and a common drain region may be formed in an uppermost portion of the active pattern and doped with dopants of the second conductivity type, wherein the active pattern is in contact with the common source region and the bit line is electrically connected to the common drain region. The active pattern may be in contact with the well region.

In some embodiments, the active pattern may be disposed in a hole penetrating the cell gate patterns and the intergate insulating patterns, and sidewalls of the cell gate patterns and the intergate insulating patterns constitute a sidewall of the hole. The intergate insulating patterns and the cell gate patterns may have a line shape extending along a specific direction parallel to a top surface of the substrate.

DETAILED DESCRIPTION

Figure 1:
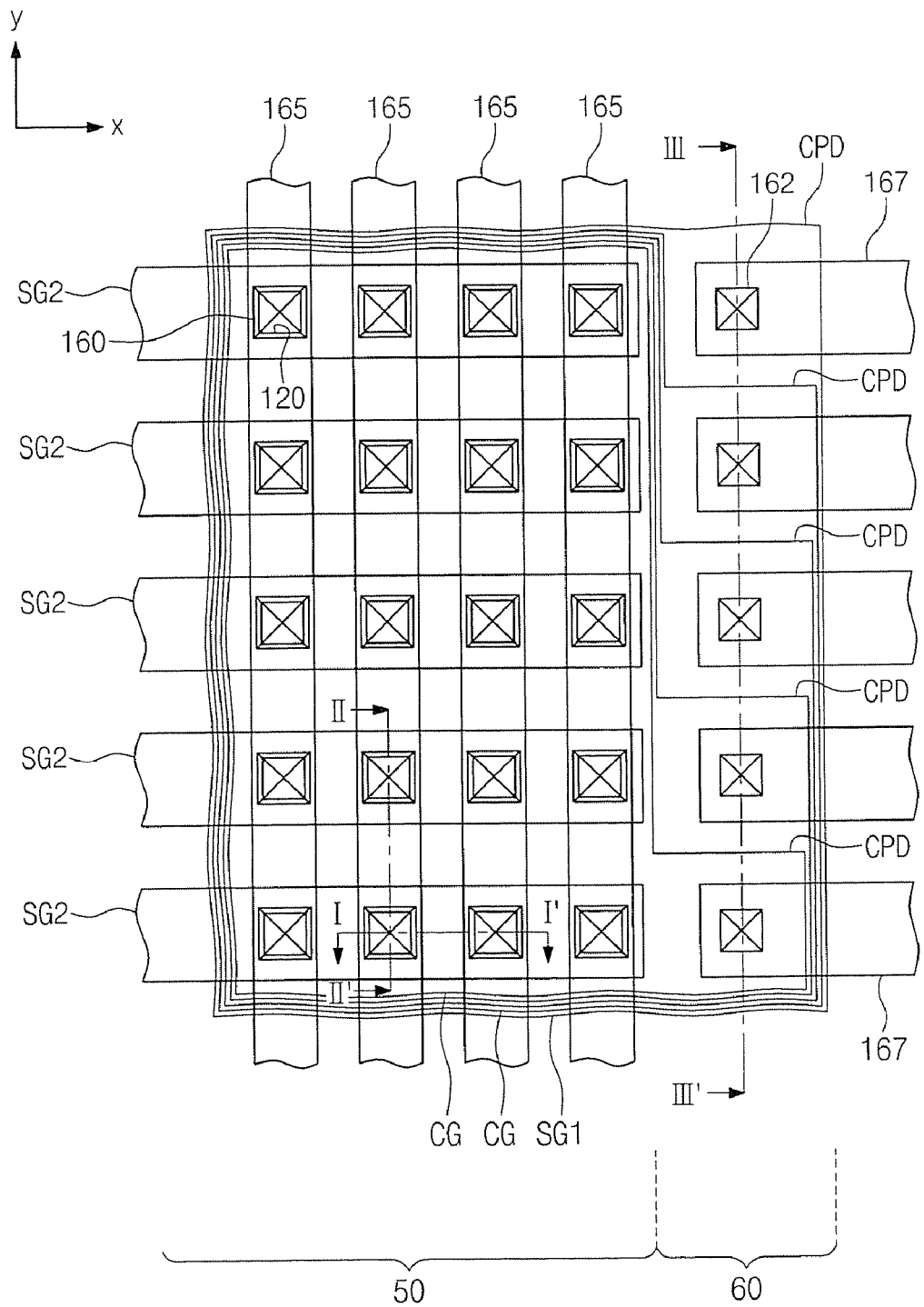
FIG. 1 is a top plan view of a nonvolatile memory device according to some embodiments of the present invention.

The present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. Like numbers refer to like elements throughout.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

It will be understood that, although the terms first, second, etc. may be used herein to describe various elements, these elements should not be limited by these terms. These terms are only used to distinguish one element from another. For example, a first region/layer could be termed a second region/layer, and, similarly, a second region/layer could be termed a first region/layer without departing from the teachings of the disclosure.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising." or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Embodiments of the present invention may be described with reference to cross-sectional illustrations, which are schematic illustrations of idealized embodiments of the present invention. As such, variations from the shapes of the illustrations, as a result, for example, of manufacturing techniques and/or tolerances, are to be expected. Thus, embodiments of the present invention should not be construed as limited to the particular shapes of regions illustrated herein, but are to include deviations in shapes that result from, e.g., manufacturing. For example, a region illustrated as a rectangle may have rounded or curved features. Thus, the regions illustrated in the figures are schematic in nature and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

In the drawings, the thickness of layers and regions are exaggerated for clarity. It will also be understood that when an element such as a layer, region or substrate is referred to as being "on" or "onto" another element, it may lie directly on the other element or intervening elements or layers may also be present. Like reference numerals refer to like elements throughout the specification.

Spatially relatively terms, such as "beneath," "below," "above," "upper," "top," "bottom", "vertical", "lateral" and the like, may be used to describe an element and/or feature's relationship to another element(s) and/or feature(s) as, for example, illustrated in the figures. It will be understood that the spatially relative terms are intended to encompass different orientations of the device in use and/or operation in addition to the orientation depicted in the figures. For example, when the device in the figures is turned over, elements described as below and/or beneath other elements or features would then be oriented (rotated 90 degrees or at other orientations) and the spatially relative descriptors used herein interpreted accordingly. As used herein, "vertical" refers to a direction that is generally orthogonal to a major face of a substrate, while "lateral" refers to a direction that is generally parallel to the major face of the substrate.

Figure 2A:
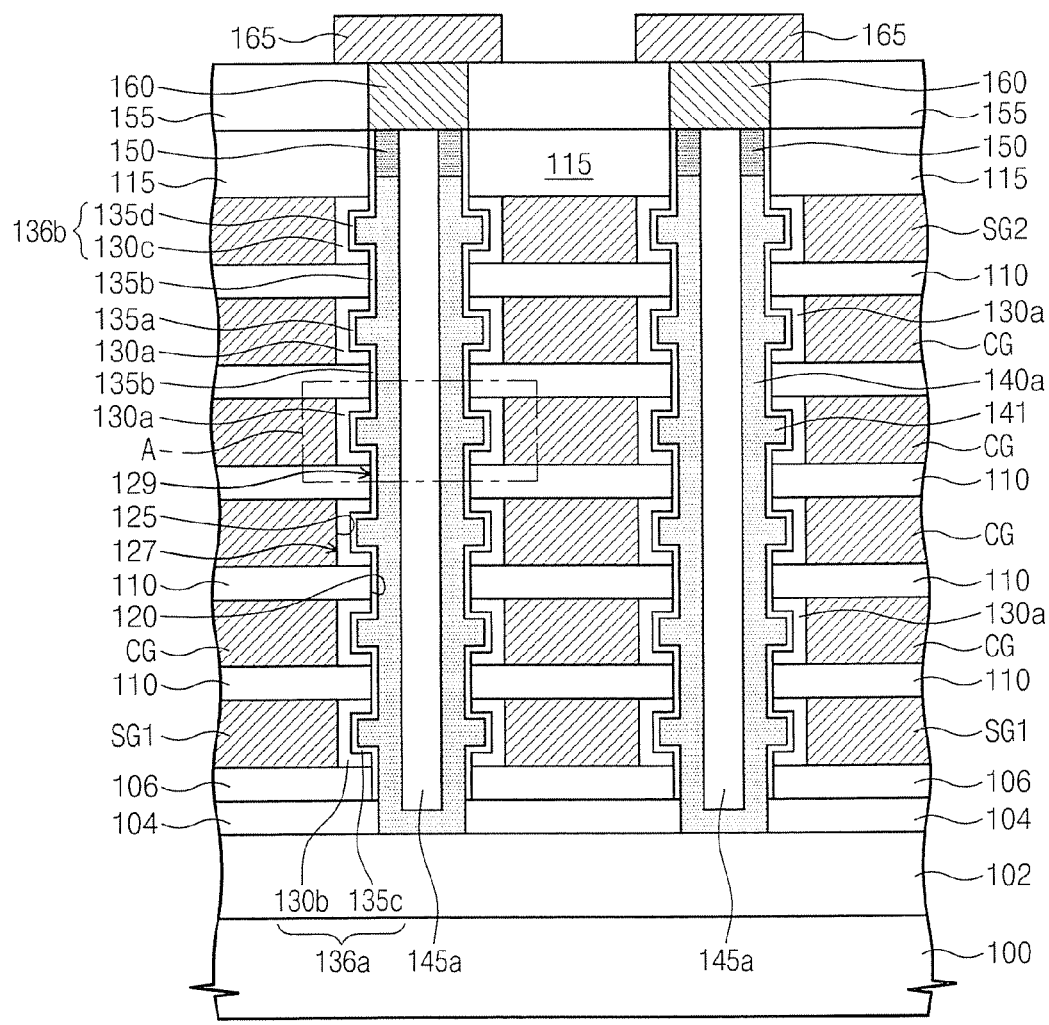
FIG. 2A is a cross section view taken along the line I-I' of FIG. 1.
Figure 2B:
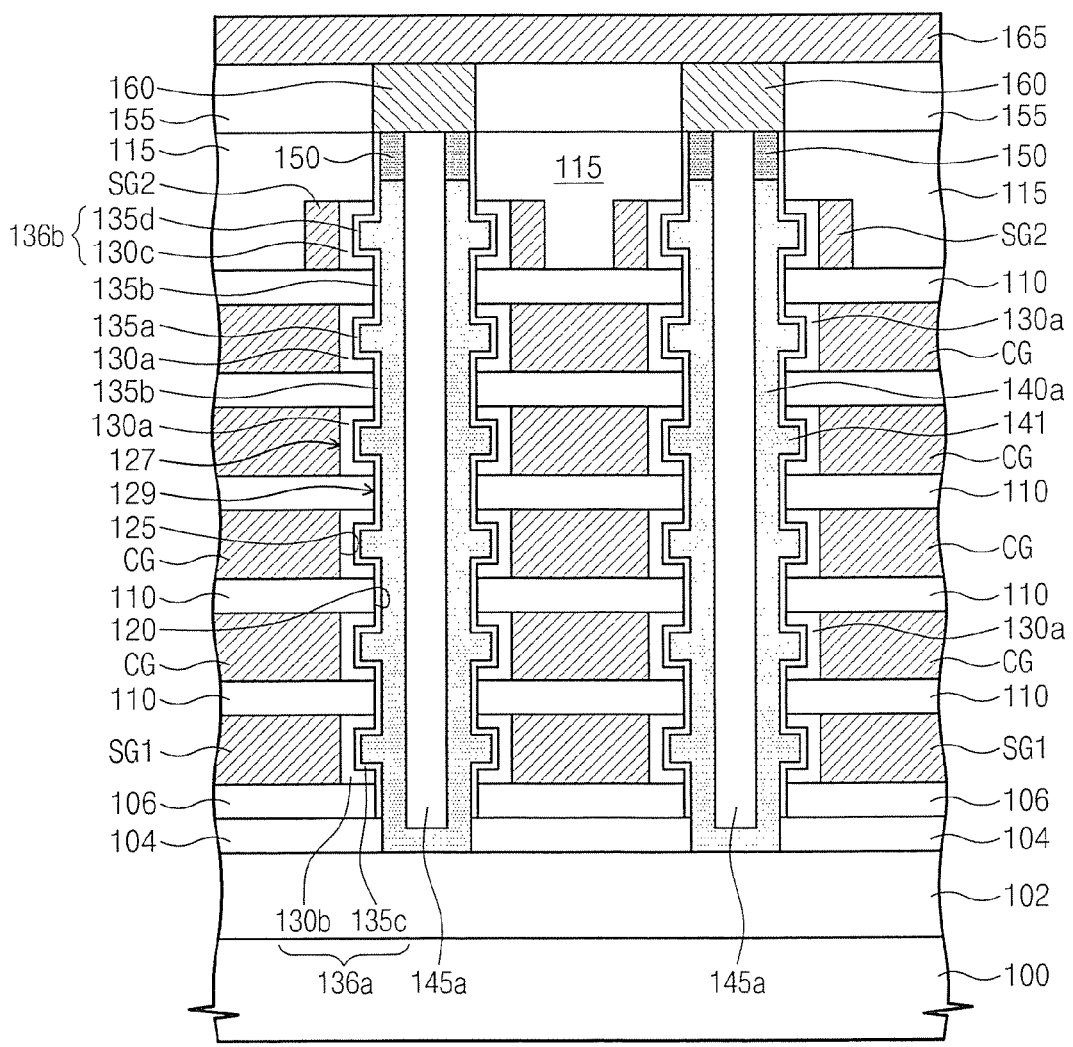
FIG. 2B is a cross section view taken along the line II-II' of FIG. 1.
Figure 2C:
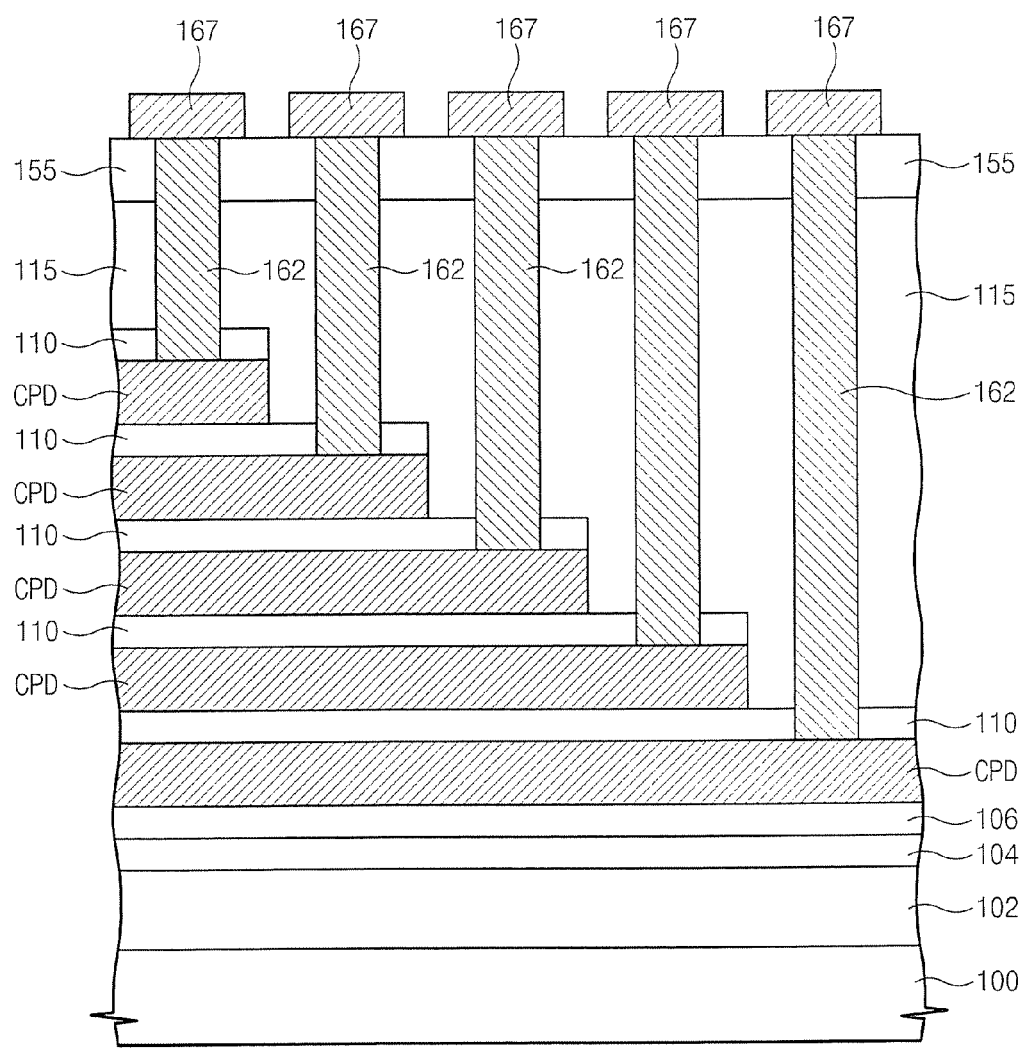
FIG. 2C is a cross section view taken along the line III-III' of FIG. 1.
Figure 2D:
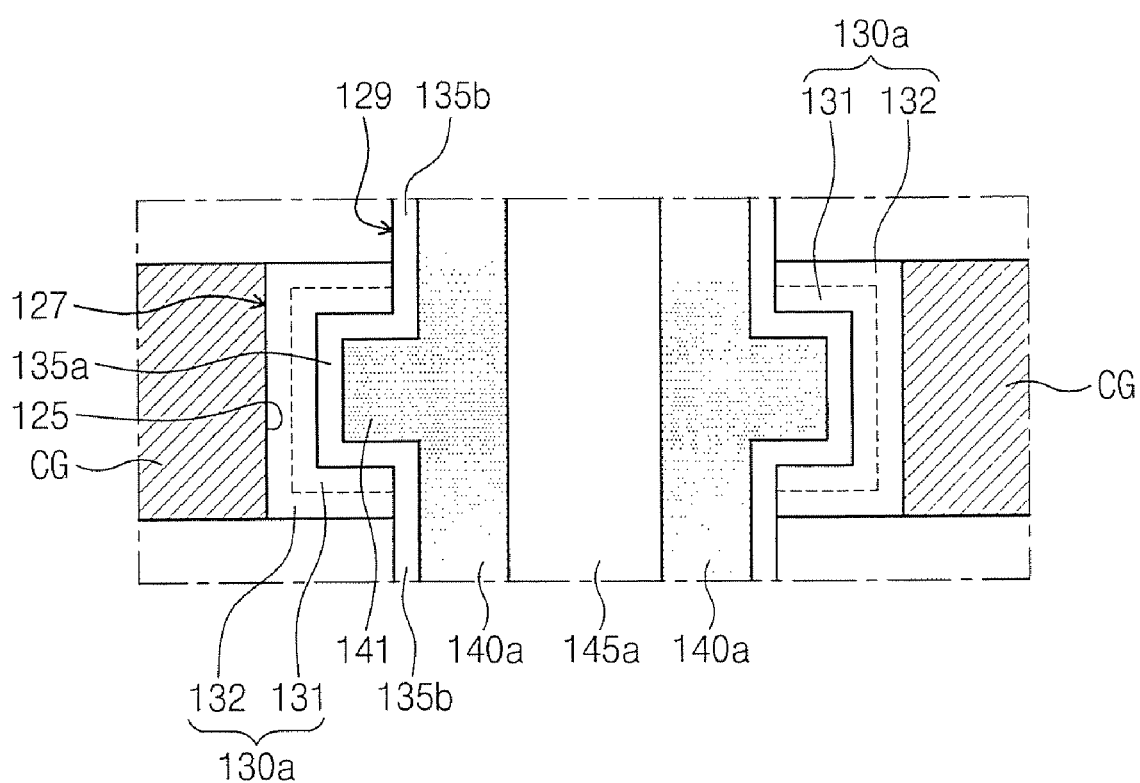
FIG. 2D is a view enlarging Region A of FIG. 1.

FIG. 1 is a top plan view of a nonvolatile memory device according to some embodiments of the present invention. FIGS. 2A, 2B and 2C are cross section views taken along the lines I-I', II-II' and III-III' of FIG. 1 respectively. FIG. 2D is a view enlarging Region A of FIG. 1.

Referring to FIGS. 1, 2A, 2B and 2D, a semiconductor substrate 100 (hereinafter, it is referred to as 'substrate') may include a peripheral circuit region (not shown) and a cell array region. Peripheral circuits for operating nonvolatile memory cells may be disposed in the peripheral circuit region. The cell array region may include a memory cell region 50 and a connection region 60. Nonvolatile memory cells are disposed in the memory cell region 50 and structures for connecting the nonvolatile memory cells to the peripheral circuits may be disposed in the connection region 60.

A well region 102 doped with dopants of a first conductivity type is disposed in the substrate 100 in the memory cell region 50. The well region 102 may be disposed in an entire portion of the memory cell region 50. The well region 102 may extend in the substrate 100 in the connection region 60. A common source region 104 doped with dopants of a second conductivity type may be disposed in the well region 102. A top surface of the common source region 104 may be identical to a top surface of the substrate 100. The common source region 104 may be disposed in an entire portion of the memory cell region 50. In addition, the common source region 104 may extend in the substrate of the connection region 60 together with the well region 50.

A plurality of intergate insulating patterns 110 and a plurality of cell gate patterns CG are alternately stacked on the substrate of the memory cell region 50. The cell gate patterns CG may cover the substrate 110 of the memory cell region 50. A first select gate pattern SG1 is disposed between the lowermost cell gate pattern CG and the substrate 100 and a base insulating layer 106 is disposed between the first select gate pattern SG1 and the substrate 100. The lowermost intergate insulating pattern 110 is disposed between the first select gate pattern SG1 and the lowermost cell gate pattern CG.

A second select gate pattern SG2 is disposed on the uppermost cell gate pattern CG. The uppermost intergate insulating pattern 110 is disposed between the second select gate pattern SG2 and the uppermost cell gate pattern CG. The uppermost intergate insulating pattern 110 may be disposed on a top surface of the uppermost cell gate pattern CG. The second select gate pattern SG2 may be disposed on a portion of a top surface of the uppermost intergate insulating pattern 110. More specifically, a plurality of the second select gate patterns SG2 is disposed on the uppermost intergate insulating pattern 110 and may extend along a first direction. The first direction may correspond to an x axis of FIG. 1.

A first interlayer insulating layer 115 is disposed on a whole surface of the substrate 100. The first interlayer insulating layer 115 is disposed on the second select gate patterns SG2, the cell gate patterns CG and the first select gate pattern SG1. A plurality of holes 120 penetrates the first interlayer insulating layer 115, the second select gate patterns SG2, the cell gate patterns CG, the intergate insulating patterns 110, the first select gate pattern SG1 and the base insulating layer 106 that are disposed in the memory cell region 50. The holes 120 are two dimensionally arranged to form rows and columns. The rows may extend in the first direction (the x axis direction) and the columns may extend in a second direction (a y axis direction) perpendicular to the first direction (the x axis direction). The holes 120 constituting one row penetrate one second select gate pattern SG2.

An inner sidewall of each of the holes 120 may include sidewalls 127 of the cell gate patterns CG, sidewalls 129 of the intergate insulating patterns 110, a sidewall of the base insulating layer 106, a sidewall of the first select gate pattern SG1, a sidewall of the second select gate pattern SG2 and a sidewall of the first interlayer insulating layer 115. An active pattern 140a is disposed in each of the holes 120. The active pattern 140a is disposed on the substrate 100 in the hole 120 to extend upwardly along an inner sidewall of the hole 120. The active pattern 140a may have a shell shape or a pipe shape the inside of which is vacant. A portion of the active pattern 140a adjacent to the substrate 100 may be closed and a portion of the active pattern 140a adjacent to the first interlayer insulating layer 115 may be opened. A filling insulating pattern 145a may fill the inside of the active pattern 140a. Alternatively, the active pattern 140a may have a pillar shape filling the hole 120. When the active pattern 140a has a pillar shape, the filling insulating pattern 145a may be omitted.

The active pattern 140a may be in contact with the common source region 104. In addition, the active pattern 140a may be in contact with the well region 102. As depicted in FIGS. 2a and 2b, when the active pattern 140a is in contact with the well region 102, the hole 120 may extend downwardly to penetrate the common source region 104. Alternatively, even though it is not depicted, the active pattern 140a may not be in contact with the well region 102. In this case, a bottom surface of the hole 120 corresponds to a portion of the common source region 104 and a bottom surface of the active pattern 140a can only be in contact with the common source region 104.

A plurality of multilayer patterns 130a is disposed between the active pattern 140a and a plurality of cell gate patterns CG respectively. The plurality of multilayer patterns 130a corresponding respectively to the plurality of cell gate patterns CG is disposed in each hole 120. As depicted in FIG. 2d, each of the multilayer patterns 130a includes a charge storage pattern 131 capable of storing a charge therein. In addition, each of the multilayer patterns 130a further includes a blocking insulating pattern 132 disposed between the charge storage pattern 131 and the cell gate pattern CG. Tunnel insulating patterns 135a are disposed between the charge storage patterns 131 and the active pattern 140a respectively. A first gate insulating layer 136a is disposed between the first select gate pattern SG1 and the active pattern 140a and second gate insulating layer 136b is disposed between the second select gate pattern SG2 and the active pattern 140a.

A nonvolatile memory cell includes the cell gate pattern CG, the multilayer pattern 130a including the blocking insulating pattern 132 and the charge storage pattern 131 and the tunnel insulating pattern 135a. A first select transistor includes the first select gate pattern SG1 and the first gate insulating layer 136a and a second select transistor includes the second select gate pattern SG2 and the second gate insulating layer 136b. A plurality of nonvolatile memory cells, the first select transistor and the second select transistor that are formed on the one active pattern 140a constitute one cell string. The nonvolatile memory cells in the cell string are vertically and serially connected to each other. The first and second select transistors in the cell string are serially connected to both edges of the nonvolatile memory cells respectively. When the nonvolatile device operates, inversion layers may be formed in the active pattern 140a between the gate patterns (SG1, CG, SG2) and between the common source region 104 and the first select gate pattern SG1 by a fringe electric field of the gate patterns (SG1, CG, SG2). The nonvolatile memory cells, the select transistors and the common source region in the cell string can be electrically connected to each other by the inversion layers.

The charge storage patterns 131 may include an insulating material having traps capable of storing charges. For example, the charge storage patterns 131 may include at least one selected from a nitride, an oxide, a metallic oxide and nano dots. The tunnel insulating pattern 135a may include at least one selected from an oxide, an oxynitride and a nitride. The blocking insulating pattern 132 may include a high dielectric material (e.g., insulating metal nitride, such as a hafnium oxide or an aluminum oxide) having a dielectric constant higher than the tunnel insulating pattern 135a.

The charge storage patterns 131 in the cell string may be separated each other. In other words, it is prefer that one charge storage pattern 131 of the nonvolatile memory cell is separated from another charge storage pattern(s) adjacent under and/or over to the one charge storage pattern. The blocking insulating layers 132 included in the cell string may be separated each other. That is, the multilayer patterns 130a in the cell string may be separated each other.

One sidewall 127 of the cell gate pattern CG is recessed sideward to define an undercut region 125. More specifically, the one sidewall 127 of the cell gate pattern CG is recessed sideward more than one sidewall 129 of the intergate insulating pattern 110. As a result, an inner sidewall of the hole 120 has an uneven shape. A concave portion of the inner sidewall of the hole 120 corresponds to the undercut region 125. The undercut region 125 may correspond to a space surrounded by the recessed sidewall 127 of the cell gate pattern CG and end portions of the intergate insulating patterns 110 located just under and on the cell gate pattern CG. The charge storage pattern 131 may be disposed in the undercut region 125. A plurality of undercut regions 125 corresponding to the plurality of cell gate patterns CG respectively is defined in each of the holes 120. The charge storage patterns 131 may be disposed in the plurality of undercut regions 125 respectively to be separated from each other. The blocking insulating pattern 132 may also be disposed in the plurality of undercut regions 125 respectively to be separated from each other.

Thus, the multilayer 130a may be disposed in the plurality of undercut regions 125 respectively to be separated from each other. The multilayer patterns 130a may be conformally disposed along a top surface, a bottom surface and a sidewall of the undercut region 125.

The tunnel insulating patterns 135a included in the cell string may downwardly and/or upwardly extend to be directly connected to each other. More specifically the tunnel insulating pattern 135a is disposed between one sidewall of the cell gate pattern CG and the active pattern 140a and an extended portion 135b of the tunnel insulating pattern 135a may be disposed between one sidewall 129 of the intergate insulating pattern 110 and the active pattern 140. The extended portions 135b of the adjacent tunnel insulating patterns 135a are directly connected to each other without an interface. In other words, one continuous tunnel insulating layer is disposed between the one active pattern 140a and the plurality of charge storage patterns 131. The tunnel insulating pattern 135a may be conformally disposed along a top surface, a bottom surface and a sidewall of the undercut region 125. Thus, the multilayer pattern 130a and the tunnel insulating pattern 135a can fill only a portion of the undercut region 125. The active pattern 140a may include a protrusion 141 extended into the undercut region 125. The undercut region 125 may be filled with the multilayer pattern 130a, the tunnel insulating pattern 135a and the protrusion 141 of the active pattern 140a.

The first gate insulating layer 136a may include a first pattern 130b formed of the same material as the multilayer pattern 130a and a second pattern 135c formed of the same material as the tunnel insulating pattern 135a. The first pattern 130b of the first gate pattern 136a may include a first portion formed of the same material as the charge storage pattern 131 and a second portion formed of the same material as the blocking insulating pattern 132. The first pattern 130b of the first gate insulating layer 136a and the adjacent multilayer pattern 130a of the nonvolatile memory cell can be separated from each other. One sidewall of the first select gate pattern SG1 included in the inner sidewall of the hole 120 is recessed sideward to define an undercut region 125 and the first pattern 130b may be disposed in the undercut region 125. The second pattern 135c of the first gate insulating layer 136a may extend upwardly to be directly connected to the extended portion 135b of the adjacent tunnel insulating pattern 135a of the nonvolatile memory cell.

Similarly, the second gate insulating layer 136b may include a first pattern 130c formed of the same material as the multilayer pattern 130a and a second pattern 135d formed of the same material as the tunnel insulating pattern 135a. The first pattern 130c of the second gate insulating layer 136b and the adjacent multilayer pattern 130a of the nonvolatile memory cell can be separated from each other. The first pattern 130c of the second gate insulating layer 136b may be disposed in an undercut region 127 defined by one sidewall of the second select gate pattern SG2 recessed laterally. The second pattern 135c of the second gate insulating layer 136b extends downwardly to be directly connected to the extended portion 135b of the adjacent tunnel insulating pattern 135a of the nonvolatile memory cell.

Referring to FIGS. 1, 2A and 2B, a common drain region 150 doped with dopants of second conductivity type is disposed in an upper portion of the active pattern 140a. A bottom surface of the common drain region 150 may have a height adjacent to a height of a top surface of the second select gate pattern SG2. A second interlayer insulating layer 155 is disposed on the first interlayer insulating layer 115 and bit lines 165 are disposed on the second interlayer insulating layer 155. The bit lines 165 are expended in the second direction (the y axis direction) in parallel. The bit lines 165 cross the second select gate patterns SG2 in parallel. The bit lines 165 are electrically connected to the common drain region 150 through a bit line plug 160 penetrating the second interlayer insulating layer 155.

One active pattern 140a is selected by the bit lines 165 and the second select gate patterns SG2 and one among the nonvolatile memory cells in the cell string formed in the selected active pattern 140a can be selected by selecting one among the cell gate patterns CG.

According to the nonvolatile memory device described above, the charge storage patterns 131 in the cell string are separated from each other. Thus, charges stored in the charge storage patterns 131 are prevented from being diffused to charge storage patterns 131 of adjacent other nonvolatile memory cells. As a result, reliability of the nonvolatile memory device can be improved.

If the charge storage patterns 131 are connected to each other, even though charges are stored in traps of the charge storage patterns, the charges stored in the traps may move to adjacent nonvolatile memory cells through the traps. Therefore, data disturbance can occur, resulting in degradation of reliability of the nonvolatile memory device. However, according to some embodiments of the present invention, since the charge storage patterns 131 are separated from each other, charges stored in the charge storage patterns 131 are prevented from being diffused into adjacent other nonvolatile memory cells below and/or above. As a result, a nonvolatile memory device having superior reliability can be provided.

Also, the tunnel insulating patterns 135a in the cell string extend up and/or down to be directly connected to each other. Thus, the tunnel insulating patterns 135a are not exposed to an etching process for a separation. When the tunnel insulating patterns 135a are exposed to an etching process for a separation, reliability of the tunnel insulating patterns 135a may be greatly degraded. Consequently, the tunnel insulating patterns 135a extend up and/or down to be directly connected to each other, thereby minimizing degradation of reliability of the tunnel insulating patterns 135a.

Referring to FIGS. 1, 2a and 2c, pads CPD may extend from the first select gate pattern SG1 and the cell gate patterns CG to be disposed in the connection region 60. The base insulating layer 106 and the intergate insulating patterns 110 may also extend in the connection region 60. The pads CPD may be formed to have a stair shape in the connection region 60. At this time, the pads CPD may have a stair shape going in the second direction (the y axis direction). The pads CPD may have a gradually narrowing, two-dimensional area as the pads CPD approach the top. The pad (CPD) of the first select gate pattern SG1 may have the greatest area and the pad (CPD) of the uppermost cell gate pattern CG may have the smallest area.

The first interlayer insulating layer 115 and the second interlayer insulating layer 155 are also disposed on the pads CPD. A plurality of connection plugs 162 penetrates the second and first interlayer insulating layers 155 and 115 consecutively to be connected to the pads CPD respectively. The pads CPD may be formed to have a stair shape going in the second direction (the y axis direction). Thus, horizontal distances between the connection plugs 162 and the cell gate patterns CG of the memory cell region 50 may be substantially equal to each other. Therefore, a two-dimensional area of the connection region 60 can be reduced. The connection plugs 162 may have different heights. A plurality of connecting interconnection lines 167 is disposed to be separated from each other on the second interlayer insulating layer 155 of the connection region 60. The connecting interconnection lines 167 are connected to the connection plugs 162 respectively. The connecting interconnection lines 167 may extend in a peripheral circuit region (not shown) to be electrically connected to peripheral circuits.

Interconnection lines (not shown) electrically connected to the second select gate patterns SG2 may be disposed on the second interlayer insulating layer 155. The interconnection lines (not shown) connected to the second select gate patterns SG2 may not be disposed on the connection region 60.

Operations for forming a nonvolatile memory device according to the present embodiment will be described.

FIGS. 3A through 3I are cross section views taken along the line I-I' of FIG. 1 to illustrate operations for a nonvolatile memory device according to some embodiments of the present invention.

Figure 3A:
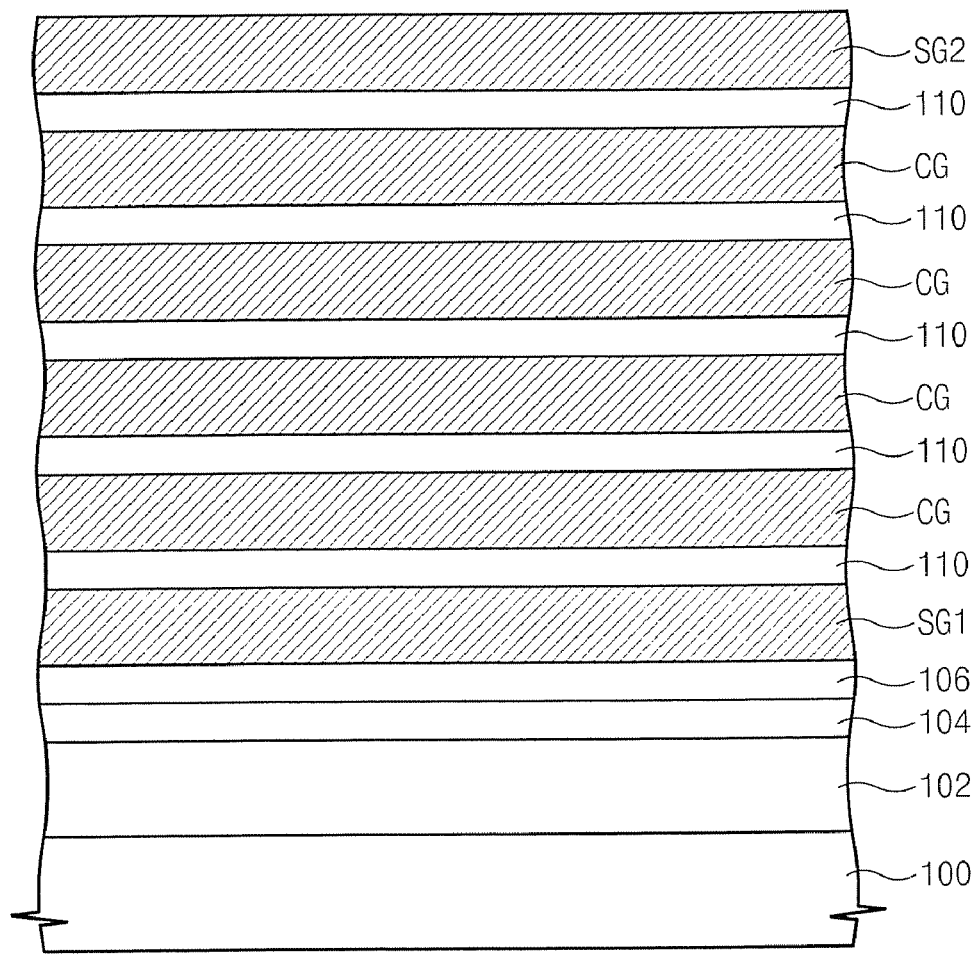
FIGS. 3A through 3I are cross section views taken along the line I-I' of FIG. 1 illustrating operations for forming a nonvolatile memory device according to some embodiments of the present invention.

Referring to FIG. 3A, a substrate 100 including a memory cell region 50 and a connection region 60 (see FIG. 1) is provided. A well region 102 may be formed by supplying dopants of a first conductive type into the substrate in the memory cell region 50. The well region 102 may be further formed in the substrate 100 in the connection region 60. A common source region 104 may be formed by counter doping an upper portion of the well region 102 with dopants of a second conductive type. The common source region 104 may be formed in the well region 102 of the memory cell region 50 and the connection region 60.

A base insulating layer 106 is formed on a surface of the substrate 100 including the common source region 104. The base insulating layer 106 may include at least one among an oxide layer, a nitride layer and an oxynitride layer. Transistors and/or resistors for constituting a peripheral circuit may be formed in a peripheral circuit region (not shown) of the substrate 100 before forming the base insulating layer 106.

A first select gate conductive layer is formed on the base insulating layer 106 and a plurality of intergate insulating layers and a plurality of cell gate conductive layers are alternately formed on the first select gate conductive layer. A second select gate conductive layer is formed on the uppermost intergate insulating layer among the intergate insulating layers. The first select gate conductive layer, the cell gate conductive layer and the second select gate conductive layer may include at least one selected from a group consisting of doped silicon, doped germanium, doped silicon-germanium, metal (e.g., tungsten, aluminum, titanium, tantalum), metal silicide (e.g., tungsten silicide, cobalt silicide) and conductive metal nitride (e.g., titanium nitride, tantalum nitride). The first select gate conductive layer, the cell gate conductive layer and the second select gate conductive layer may be formed of the same conductive material. Alternatively, the first select gate conductive layer, the cell gate conductive layer and the second select gate conductive layer may be formed of different conductive materials. The intergate insulating layers may be formed of an oxide layer, a nitride layer and/or an oxynitride layer.

The second select gate conductive layer is patterned to form a second select gate patterns SG2 extending in parallel to each other in a first direction (an x axis direction of FIG. 1). The second select gate patterns SG2 may be formed in the memory cell region 50.

The intergate insulating layers, the cell gate conductive layers and the first select gate conductive layer are consecutively patterned to form a first select gate pattern SG1 and intergate insulating patterns 110 and cell gate patterns CG that are alternately stacked. The first select gate pattern SG1, the intergate insulating patterns 110 and the cell gate patterns CG may cover the substrate 100 in the memory cell region 50. The first select gate pattern SG1, the intergate insulating patterns 110 and the cell gate patterns CG may also cover the substrate 100 in the connection region 60.

A patterning process may be performed on the gate patterns (CG, SG1) and the intergate insulating patterns 110 of the connection region 60 to form pads CPD illustrated in FIGS. 1 and 2c. Top surfaces of the pads CPD are exposed at different locations. The patterning process may include a photolithography process and an etching process. The pads CPD can be formed by performing patterning processes the number of which is less than the number of layers of the pads CPD. These will be described referring to FIGS. 4A through 4C.

Figure 4A:
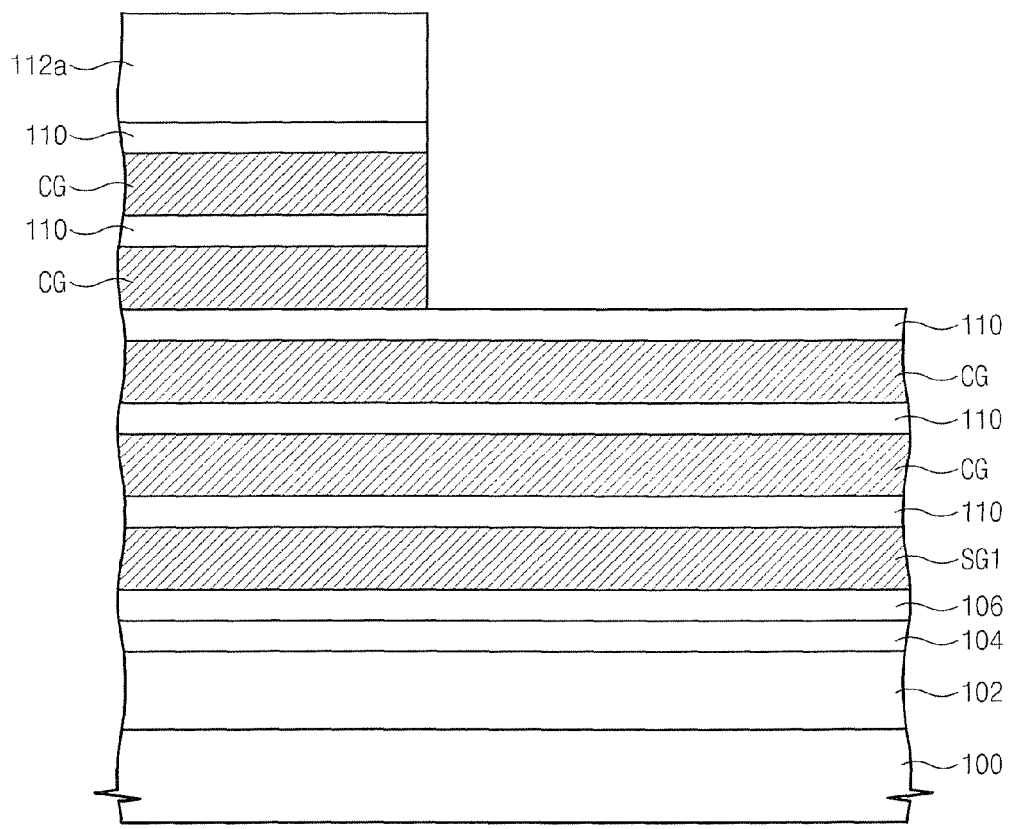
FIGS. 4A through 4C are cross section views taken along the line III-III' of FIG. 1 illustrating operations for forming a connection pad of a nonvolatile memory device according to some embodiments of the present invention.
Figure 4B:
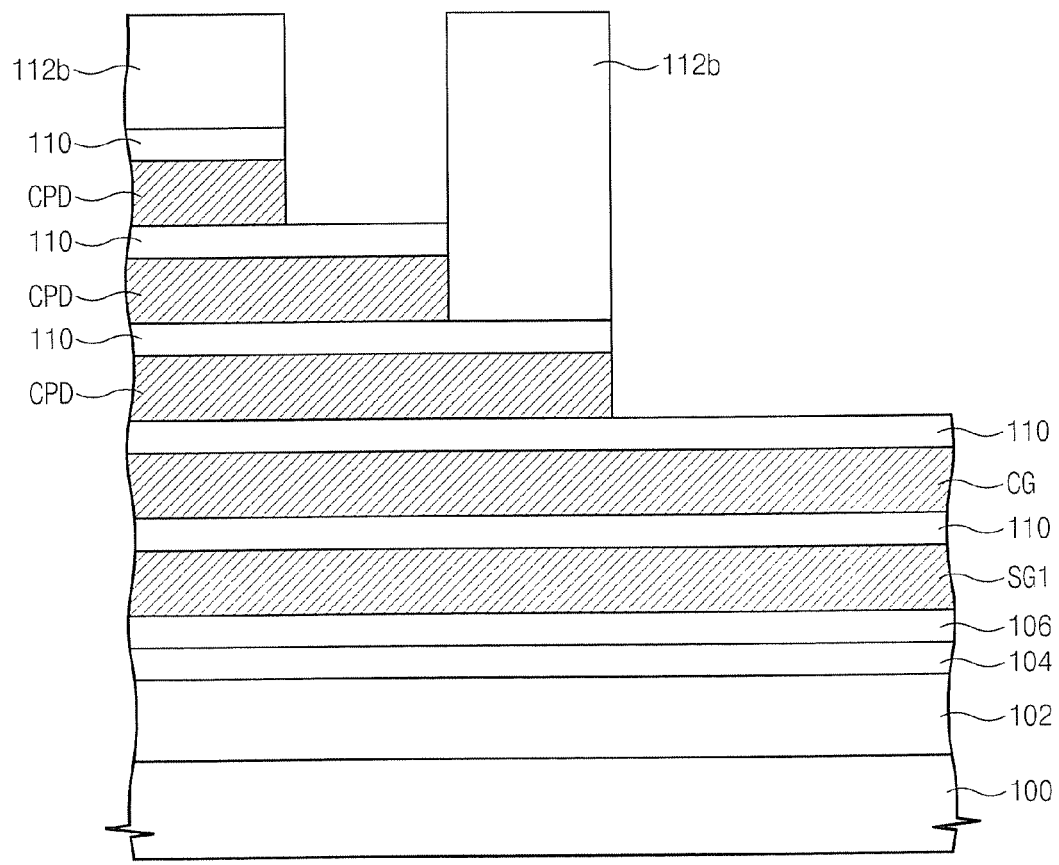
Figure 4C:
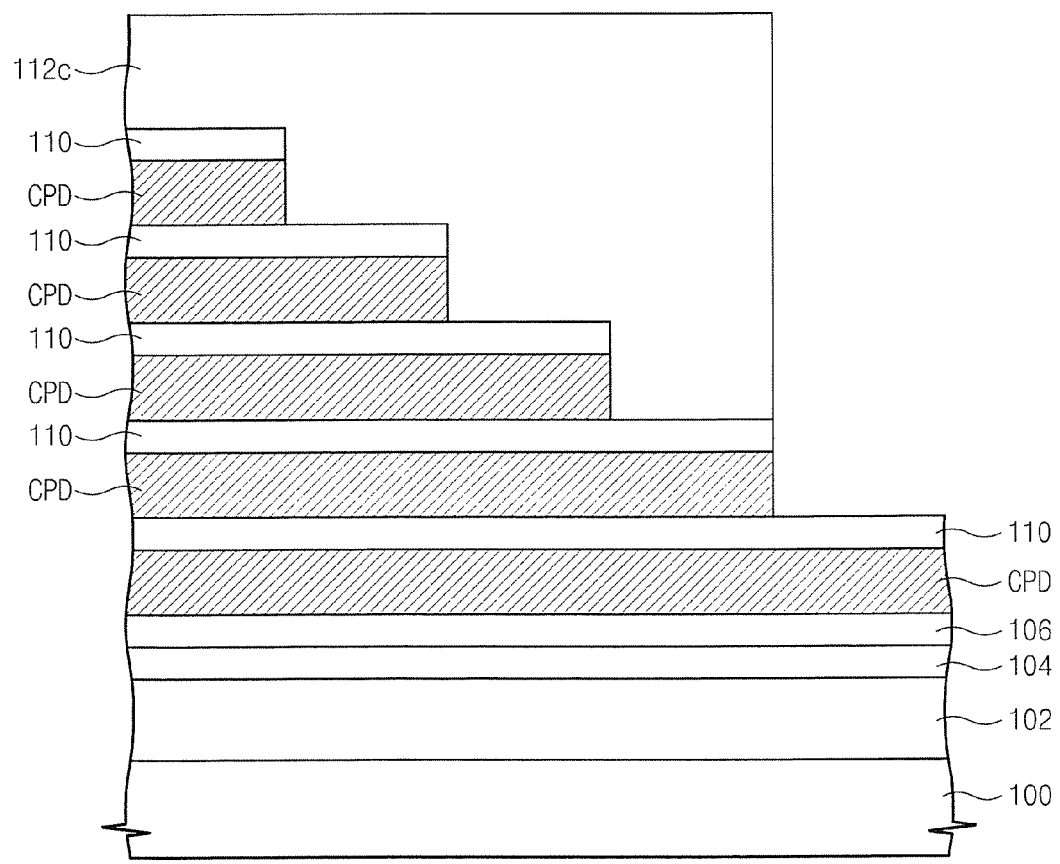

FIGS. 4A through 4C are cross section views taken along the line of FIG. 1 to illustrate operations for forming connection pads of a nonvolatile memory device according to some embodiments of the present invention.

Referring to FIGS. 1, 2C and 4A, pads (CPD of FIG. 2C) to be formed in the connection region 60 are divided into a first group and a second group. The number of layers of the first group pads CPD may be identical to the number of layers of the second group pads CPD or ±1 of the number of layers of the second group pads CPD. When the total number of layers of the pads CPD to be formed in the connection region 60 is an even number, the number of layers of the first group pads CPD may be identical to the number of layers of the second group pads CPD. When the total number of layers of the pads CPD to be formed in the connection region 60 is an odd number, the number of layers of the first group pads CPD may be identical to ±1 of the number of layers of the second group pads CPD.

For convenience, pads CPD having five layers are depicted in FIG. 2C. The number of layers of the first group pads may be two and the number of layers of the second group pads may be three. The present invention is not limited to this. The number of layers of the first group pads may be three and the number of layers of the second group pads may be two.

A first photolithography process dividing a first region and a second region in the connection region 60 is performed. A first mask pattern 112a formed by the first photolithography process cover gate patterns (SG1, CG) of the first region of the connection region 60. At this time, gate patterns (SG1, CG) of the second region are exposed. The first region corresponds to a region where the first group pads CPD are formed and the second region corresponds to a region where the second group pads CPD are formed. The first mask pattern 112a covers the memory cell region 50.

A first etching process is performed using the first mask pattern 112a as an etching mask. The gate pattern CG formed as the uppermost pad (CPD) among the second group pads CPD is exposed by the first etching process. The first photolithography process and the first etching process are included in a first patterning process.

Referring to FIGS. 1, 2C and 4B, the first group pads CPD are divided into two sub groups using the same method dividing the first and second groups, and the second group pads CPD are also divided into two sub groups using the same method described above. The two sub groups in the first group are defined to as a first sub group and a second sub group respectively and the two sub groups in the second group are defined to as a third sub group and a fourth sub group respectively. In the present embodiment, the number of layers of pad of the respective first, second and third sub groups is one and the number of pad layers of the fourth sub group is two.

The number of layers of pads CPD of the first sub group may be identical to the number of layers of pads CPD of the second sub group or ±1 of the number of layers of pads CPD of the second sub group. Similarly, the number of layers of pads CPD of the third sub group may be identical to the number of layers of pads CPD of the fourth sub group or ±1 of the number of layers of pads CPD of the fourth sub group.

Similarly, the first region is divided into two subregions and the second region is divided into two subregions. That is, the first region is divided into a first subregion where the first group pad (CPD) is formed and a second subregion where the second group pad (CPD) is formed. The second region is divided into a third subregion where the third group pad (CPD) is formed and a fourth subregion where the fourth group pad (CPD) is formed.

After performing the first patterning process, the first mask pattern 112a is removed. Subsequently, a second photolithography process is performed to form a second mask pattern 112b. The second mask pattern 112b covers the first subregion in the first region and the third subregion in the second region. At this time, a gate pattern located at the second subregion in the first region and the fourth subregion in the second region is exposed.

A second etching process is performed using the second mask pattern 112b as an etching mask. A gate pattern in the second subregion and the fourth subregion is etched by the second etching process. Thus, the first, second and third group pads CPD having one pad are formed. The second photolithography process and the second etching process are included in a second patterning process.

Referring to FIGS. 1 and 4C, the second mask pattern 112b is removed. The number of layers of pads CPD of the fourth sub group is two. Thus, the pads of the fourth sub group are divided into two sub groups. Similarly, the fourth sub group is divided into two subregions corresponding to two sub groups in the fourth sub group respectively. A third photolithography process is performed to form a third mask pattern 112c covering one subregion in the fourth subregion. At this time, a gate pattern of the other subregion in the fourth subregion is exposed. The third mask pattern 112c covers other pads CPD already formed. Also, the third mask pattern 112c may cover the memory cell region 50. A third etching process is performed using the third mask pattern 112c as an etching mask. Thus, two pads CPD are formed in the fourth subregion. The third photolithography process and the third etching process are included in a third patterning process.

As the method described above, the connection region 60 is divided into a first region and a second region. All the pads CPD in the connection region 60 can be formed by performing patterning processes less than the entire number of layers of the pads by patterning a portion of the first region and a portion of the second region at the same time.

More specifically, when the total number (X) of layers in the connection region 60 is $2^{n-1}<X\leq 2^n$ (n is a natural number), the number of patterning processes becomes n. For example, when the entire number of layers of the pads CPD is 32, n is 5. That is, all the pads CPD can be formed by performing the patterning process five times when the total number of layers is 32. For another example, when the entire number of layers of the pads CPD is 64, all the pads CPD can be formed by performing patterning process six times.

Figure 3B:
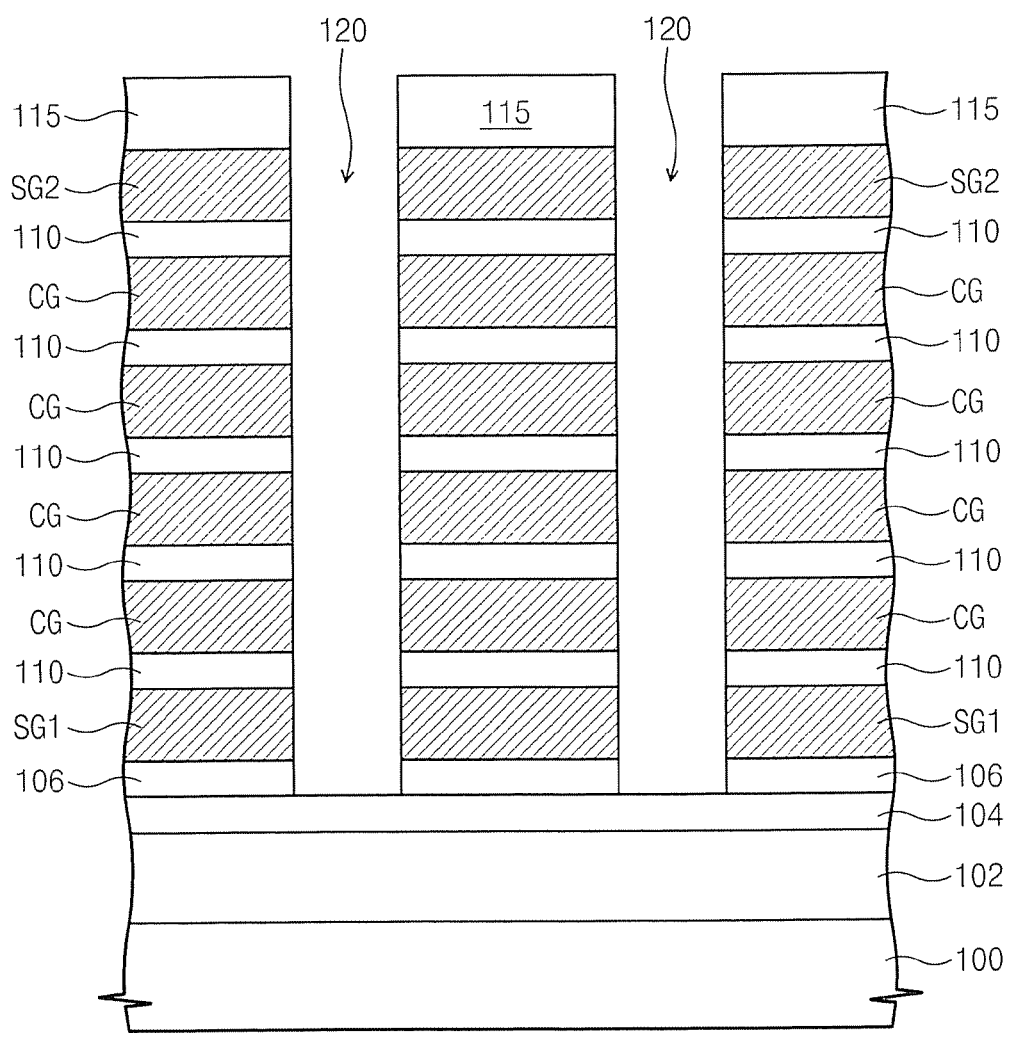

Referring to FIGS. 1 and 3B, after forming the pads CPD and the gate patterns (SG1, CG, SG2), a first interlayer insulating layer 115 covering a surface of the substrate 100 is formed. The first interlayer insulating layer 115 may be formed of an oxide layer, a nitride layer and/or an oxynitride layer.

The interlayer insulating layer 115, the second select gate pattern SG2, the cell gate patterns CG, the intergate insulating patterns 110, the first select gate pattern SG1 and the base insulating layer 106 in the memory cell region 50 are sequentially patterned to form holes 120. The holes 120 may be two-dimensionally arranged along rows and columns in the memory cell region 50. The holes 120 expose the common source region 104.

Figure 3C:
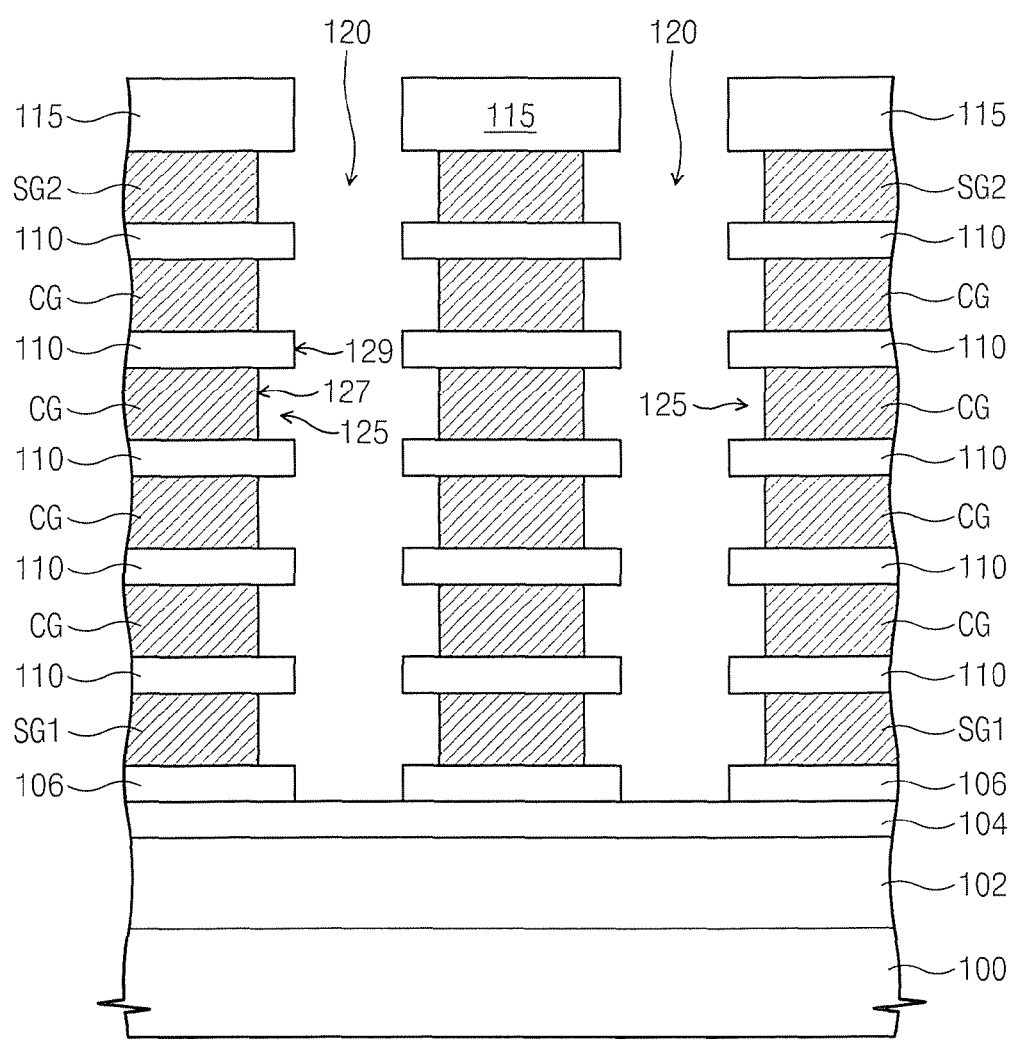

Referring to FIG. 3C, an undercut region 125 is defined by recessing the cell gate pattern CG exposed to an inner sidewall of the hole 120 laterally. Sidewalls 127 of the cell gate patterns CG may be moved laterally compared with sidewalls 129 of the intergate insulating patterns 110 by the recess process to define the undercut regions 125. The first select gate pattern SG1 and the second select gate pattern SG2 may also be recessed laterally together with the cell gate patterns CG. Thus, undercut regions 125 may be also formed beside the first and second select gate patterns (SG1. SG2). The gate patterns (SG1, CG. SG2) in the holes 120 may be recessed by an isotropic etching process (e.g., a wet etching process).

Figure 3D:
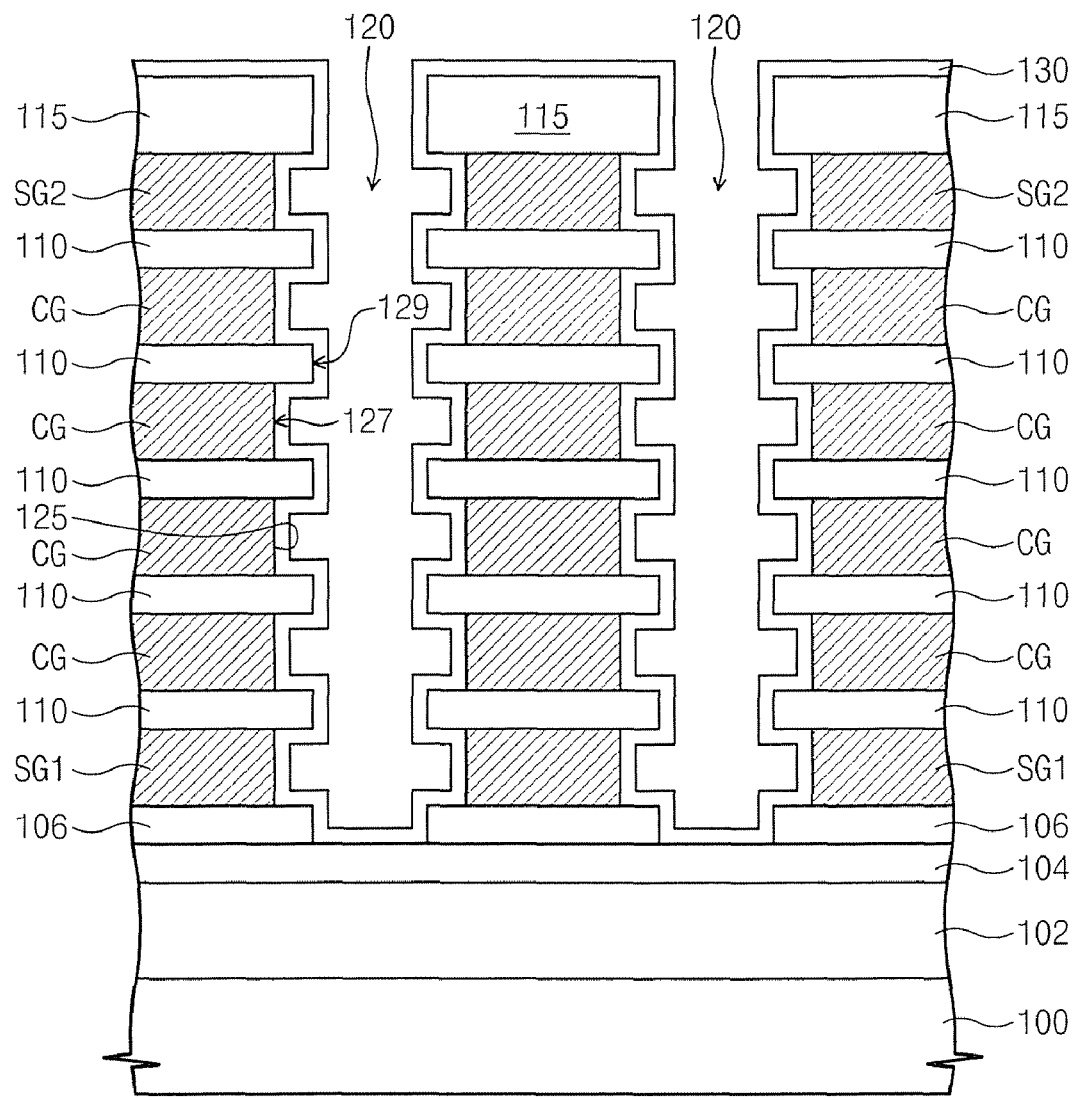

Referring to FIG. 3D, a multi-layered insulating layer 130 is formed on the substrate including the holes 120 and the undercut regions 125. The multi-layered insulating layer 130 includes a blocking insulating layer and a charge storage layer that are sequentially stacked. The multi-layered insulating layer 130 is formed in the holes 120 and the undercut regions 125. The multi-layered insulating layer 130 may also be formed on the first interlayer insulating layer 115. The multi-layered insulating layer 130 may formed along the inner sidewall of the hole 120 including the undercut regions 125. Thus, a portion of the undercut 125 may be vacant.

Figure 3E:
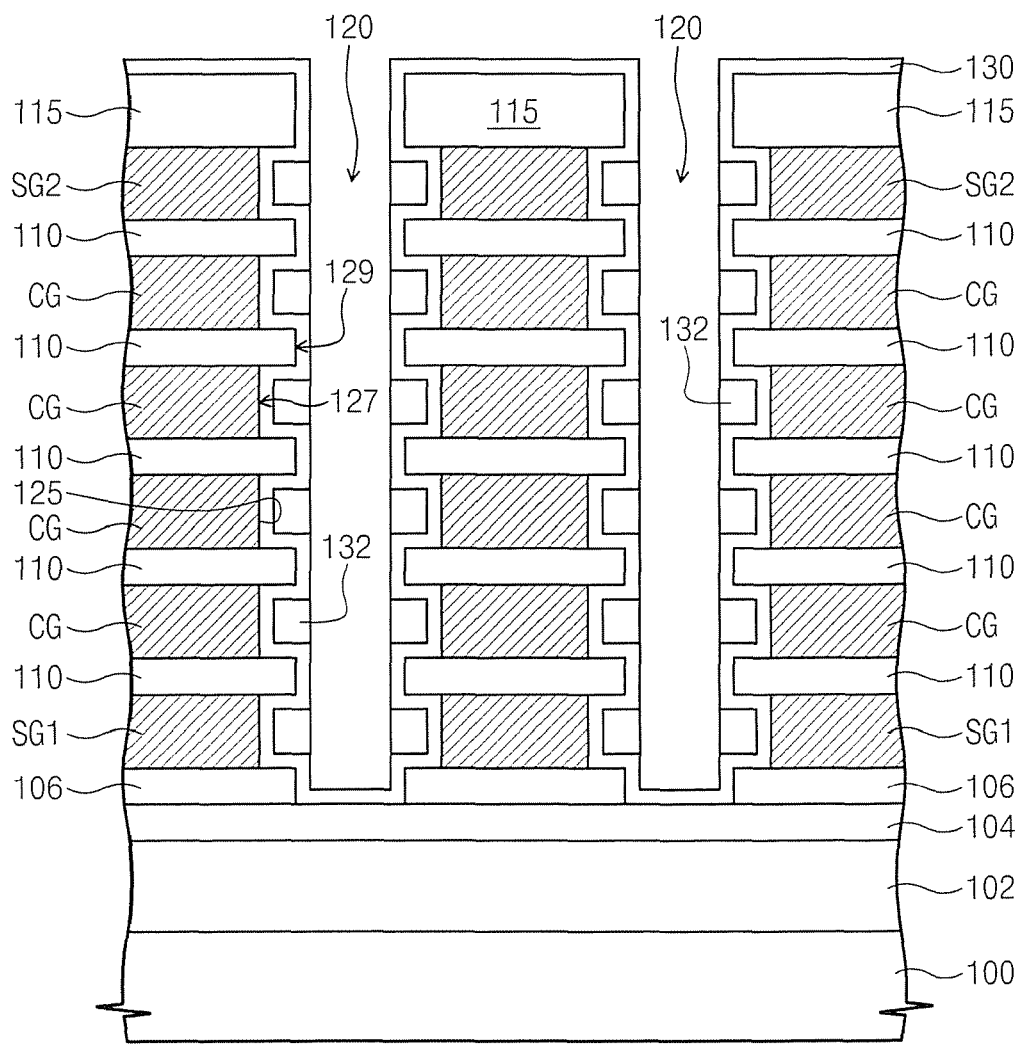

Referring to FIG. 3E, a sacrificial layer filling the hole 120 and the undercut regions 125 may be formed on the multi-layered insulating layer. The sacrificial layer may be formed of material having an etching selectivity with respect to the multi-layered insulating layer 130. For example, the sacrificial layer may be formed of an oxide layer.

The sacrificial layer is planarized down to the top surface of the first interlayer insulating layer 115, and the planarized sacrificial layer is anisotropically etched until the multi-layered insulating layer 130 disposed on the bottom surface of the hole 120 is exposed to form sacrificial patterns 132. The sacrificial pattern 132 can fill the undercut region 125. At this time, portions of the multi-layered insulating layer 130, for example, which are formed on a sidewall of the base insulating layer 106, the sidewalls 129 of the intergate insulating patterns 110 and a sidewall of the first interlayer insulating layer 115 in the hole 120 are exposed.

Figure 3F:
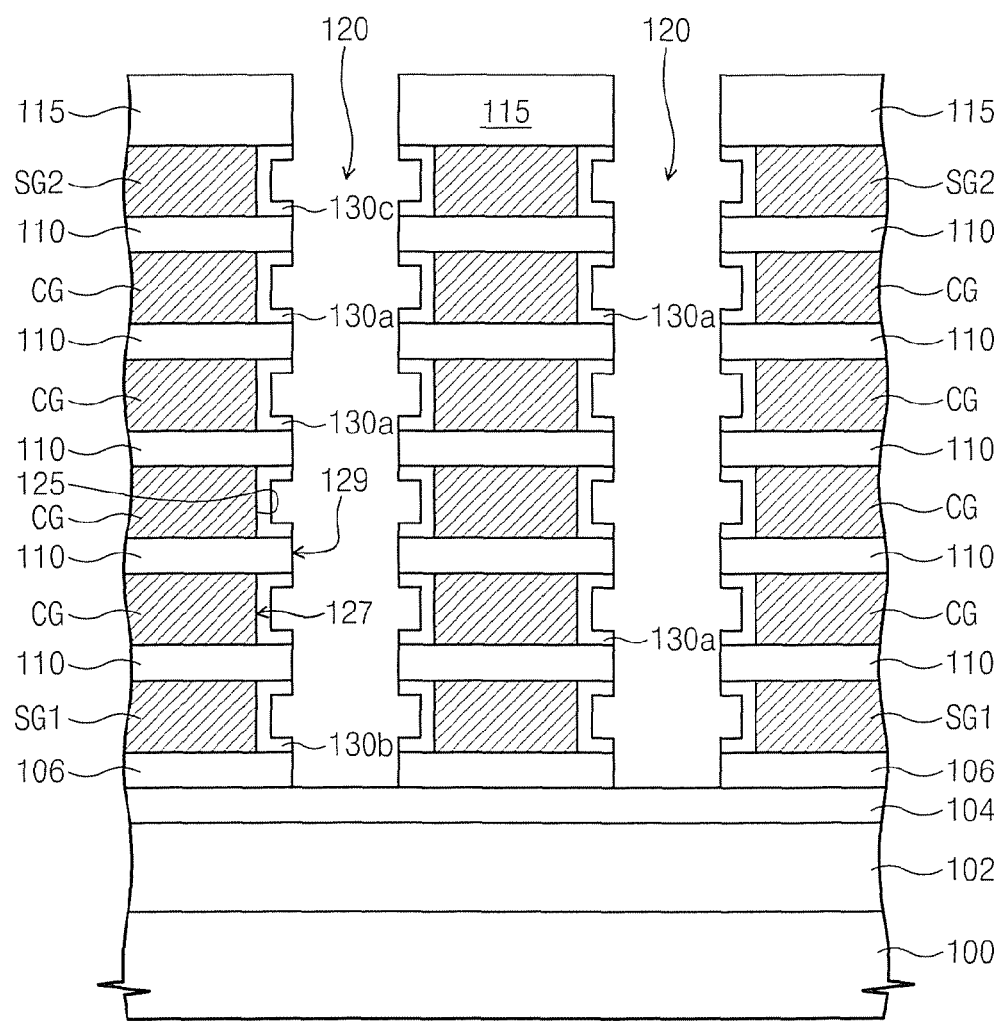

Referring to FIG. 3F, the exposed portions of multi-layered insulating layer 130 can be removed using the sacrificial patterns 132 as an etching mask. As a result, multilayer insulating patterns 130a are respectively formed in the undercut regions 125 beside the cell gate patterns CG. Since the multi-layered insulating layer 130 formed on the sidewalls 129 of the intergate insulating patterns 110 are removed, the multi-layer insulating patterns 130a in the hole 120 are separated from each other. The multi-layered insulating layer under the lowermost undercut region 125 is removed, so that the common source region 104 may be exposed. The exposed portions of multi-layered insulating layer 130 may be removed by an isotropic etching process. A first pattern 130b of a first gate insulating layer may be formed in the undercut region 125 beside the first select gate pattern SG1 and a first pattern 130c of a second gate insulating layer may be formed in the undercut region 125 beside the second select gate pattern SG2. The first patterns 130b and 130c of the first and second gate insulating layers can be separated from the adjacent multilayer insulating patterns 130a. After forming the multi-layer insulating patterns 130a, the sacrificial patterns 132 are removed. The sacrificial patterns 132 may be removed by an isotropic etching process.

According to the method described above, the multi-layered insulating patterns 130a may be formed by isotropic etching the multi-layered insulating layer 130 using the sacrificial patterns 132 as an etching mask. Alternatively, the multilayer insulating patterns 130a may be formed by removing the multi-layered insulating layer 130 outside of the undercut region 125 through anisotropic etching. In this case, the sacrificial patterns 132 may be not required. That is, the multi-layered insulating layer 130 outside of the undercut region 125 can be removed by an anisotropic etching of the multi-layered insulating layer 130 of FIG. 3d. In this case, the multi-layered insulating layer 130 on the sidewall of the first interlayer insulating layer 115, the multi-layered insulating layers 130 on the sidewalls 129 of the intergate insulating patterns 110 and the multi-layered insulating layer 130 on the sidewall of the base insulating layer 110 in the hole 120 can be sequentially removed.

Figure 3G:
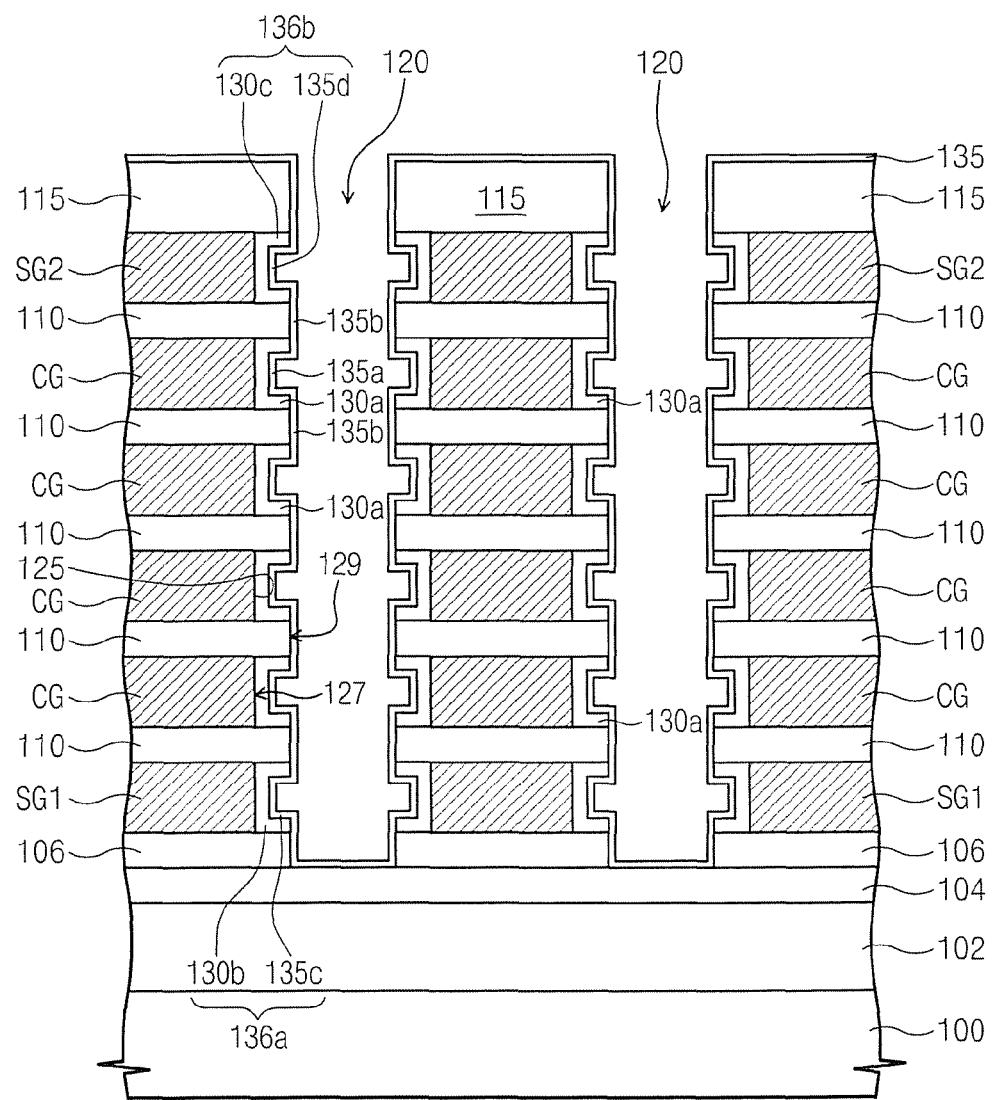

Referring to FIG. 3G, a tunnel insulating layer 135 is formed on the substrate 100 including the multilayer insulating patterns 130a. The tunnel insulating 135 may be formed to have substantially uniform thickness along surfaces of the multilayer insulating patterns 130a and the sidewalls 129 of the intergate insulating patterns 110. The tunnel insulating layer 135 may also be formed on surfaces of the first patterns 130b and 130c, a sidewall of the first interlayer insulating layer 115 in the hole 120, a sidewall of the base insulating layer 106 and a bottom surface of the hole 120. In addition, the tunnel insulating layer 135 may also be formed on a top surface of the first interlayer insulating layer 115. The tunnel insulating layer 135 may be formed by an atomic layer deposition (ALD) process.

The tunnel insulating layer disposed in the undercut region 125 corresponds to a tunnel insulating pattern 135a, and the tunnel insulating layer disposed on the sidewalls 129 of the intergate insulating patterns 110 corresponds to an extended portion 135b of the tunnel insulating pattern 135a. Since the tunnel insulating pattern 135a is formed along a surface of the multiplayer insulating pattern 130a, a portion of the undercut region 125 may be vacant. The tunnel insulating layers formed in the undercut regions 125 in which the first patterns 130b and 130c exist may correspond to second patterns 135c and 135d. The first gate insulating layer 136a includes the first pattern 130b and the second pattern 135c, and the second gate insulating layer 136b includes the first pattern 130c and the second pattern 135d.

Figure 3H:
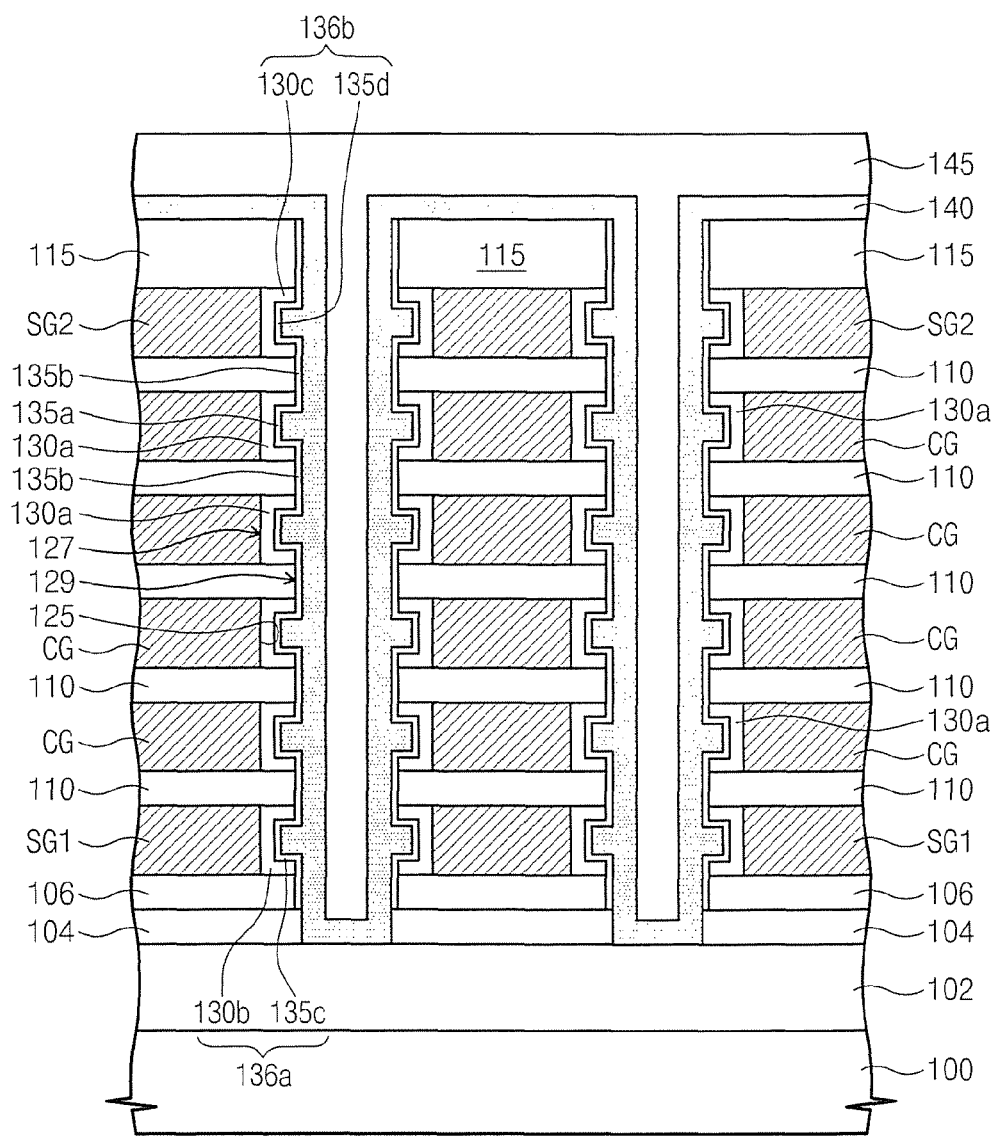

Referring to FIG. 3H, the tunnel insulating layer 135 formed on a bottom surface of the hole 120 is removed to expose the common source region 104. At this time, the extended portions 135b of the tunnel insulating pattern 135a formed on the sidewalls 129 of the intergate insulating patterns 110 remain as it is. That is, even though the tunnel insulating layer 135 formed on the bottom of the hole 120 is removed, etching damages of the tunnel insulating patterns 135a and the extended portion 135b formed on the inner sidewall of the hole 120 are minimized.

After removing the tunnel insulating layer 135 of the bottom surface of the hole 120, the exposed common source region 104 may be etched until the well region 102 is exposed. Thus, the hole 120 can extend downwardly. The common source region 104 is exposed to a sidewall of the extended portion of the hole 120.

Subsequently, an active layer 140 is formed on the substrate 100. The active layer 140 may be formed of silicon, germanium and/or silicon-germanium. The active layer 140 may be in an undoped state or may be doped with dopants of a first conductivity type which is the same type as the well region 102. The active layer 140 can fill the undercut region 125. The active layer 140 may be in contact with the well region 102 and the common source region 104. According to some embodiments of the present invention, if a process of forming the extended portion of the hole 120 is omitted, the active layer 140 may not be in contact with the well region 102.

A filling insulating layer 145 filling the hole 120 may be formed on the active layer 140. The filling insulating layer 145 may be formed of an oxide layer, a nitride layer and/or an oxynitride layer. According to some embodiments of the present invention, the active layer 140 can fill the hole 120. In this case, the filling insulating layer 145 may be omitted.

Figure 3I:
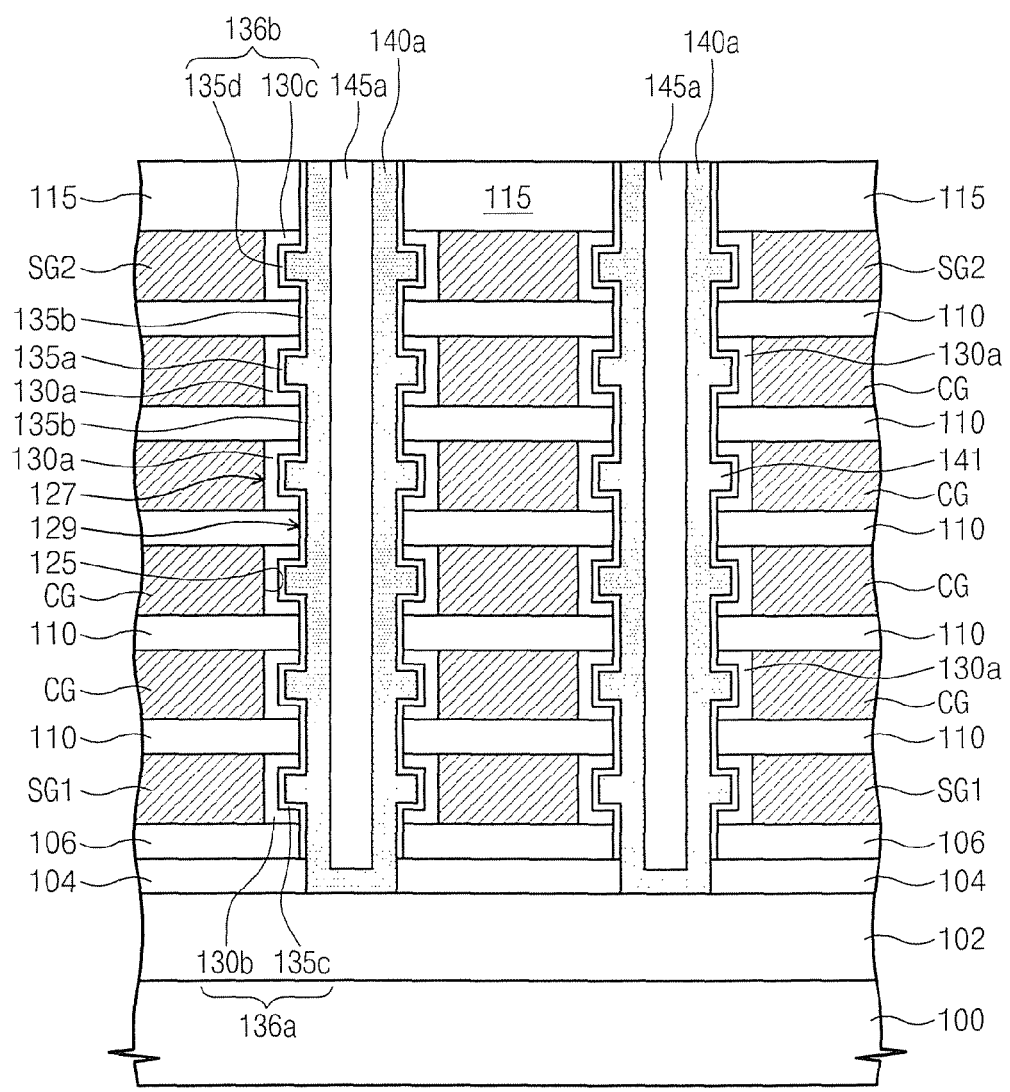

Referring to FIG. 3I, the filling insulating layer 145 and the active layer 140 are planarized until the top surface of the first interlayer insulating layer 115 is exposed so that an active pattern 140a and a filling insulating pattern 145a are formed in the hole 120.

Subsequent processes will be described referring to FIG. 2A. Dopants of a second conductivity type are supplied to an upper portion of the active pattern 140a to form the common drain region 150 of FIG. 2A. A second interlayer insulating layer 155 is formed on a surface of the substrate 100 and a bit line plug 160 penetrating the second interlayer insulating layer 155 is formed. The connection plugs 162 of FIG. 2C which consecutively penetrate the second interlayer insulating layer 155 and the first interlayer insulating layer 115 in the connection region 60 are formed. The bit line plug 160 and the connection plugs 162 may be formed at the same time. The bit line plug 160 and the connection plugs 162 are formed of conductive material. For example, the bit line plug 160 and the connection plugs 162 may include at least one selected from a group consisting of metal (e.g., tungsten, aluminum, titanium or tantalum) and conductive metal nitride (e.g., titanium nitride, tantalum nitride).

A bit line 165 connected to the bit line plug 160 is formed on the second interlayer insulating layer 150 of the memory cell region 50. An interconnection line 167 connected to the connection plug 162 is formed on the second interlayer insulating layer 150 of the connection region 60. The bit line 165 and the interconnection line 167 can be formed at the same time. The bit line 165 and the interconnection line 167 may include at least one selected from a group consisting of metal (e.g., tungsten, aluminum, titanium or tantalum) and conductive metal nitride (e.g., titanium nitride or tantalum nitride). Thus, the nonvolatile memory device illustrated in FIGS. 1, 2A through 2D can be formed.

According to the method of forming a nonvolatile memory device described above, the charge storage patterns included in the multilayer insulating patterns 130a in the hole 120 respectively are separated from each other. Thus, charges stored in the charge storage patterns are prevented from being diffused to adjacent charge storage patterns. As a result, reliability of the nonvolatile memory device can be improved.

Also, after separating the charge storage patterns, the tunnel insulating layer 135 is formed. The tunnel insulating layer 135 is not exposed to an etching process for a separation. Thus, the tunnel insulating patterns 135a are directly connected to each other by the extended portion 135b. Since the tunnel insulating patterns 135a and the extended portions 135b are not exposed to an etching process for a separation, a degradation of reliability of the tunnel insulating patterns 135a can be minimized.

A nonvolatile memory device according to the present embodiment is similar to the nonvolatile memory device of the embodiments described above. The nonvolatile memory device according to the present embodiment discloses different types of cell gate patterns.

Figure 5:
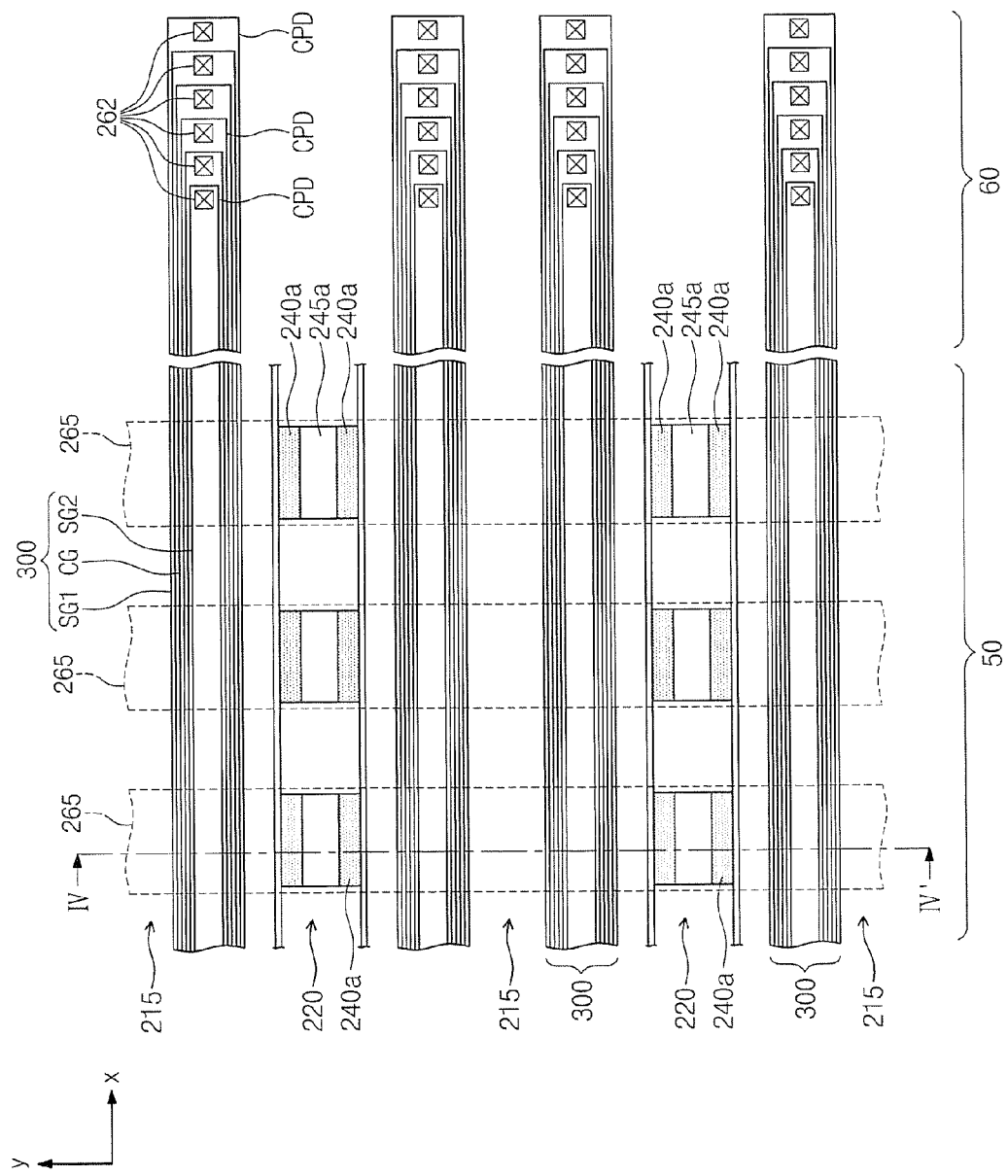
FIG. 5 is a top plan view of a nonvolatile memory device according to further embodiments of the present invention.
Figure 6:
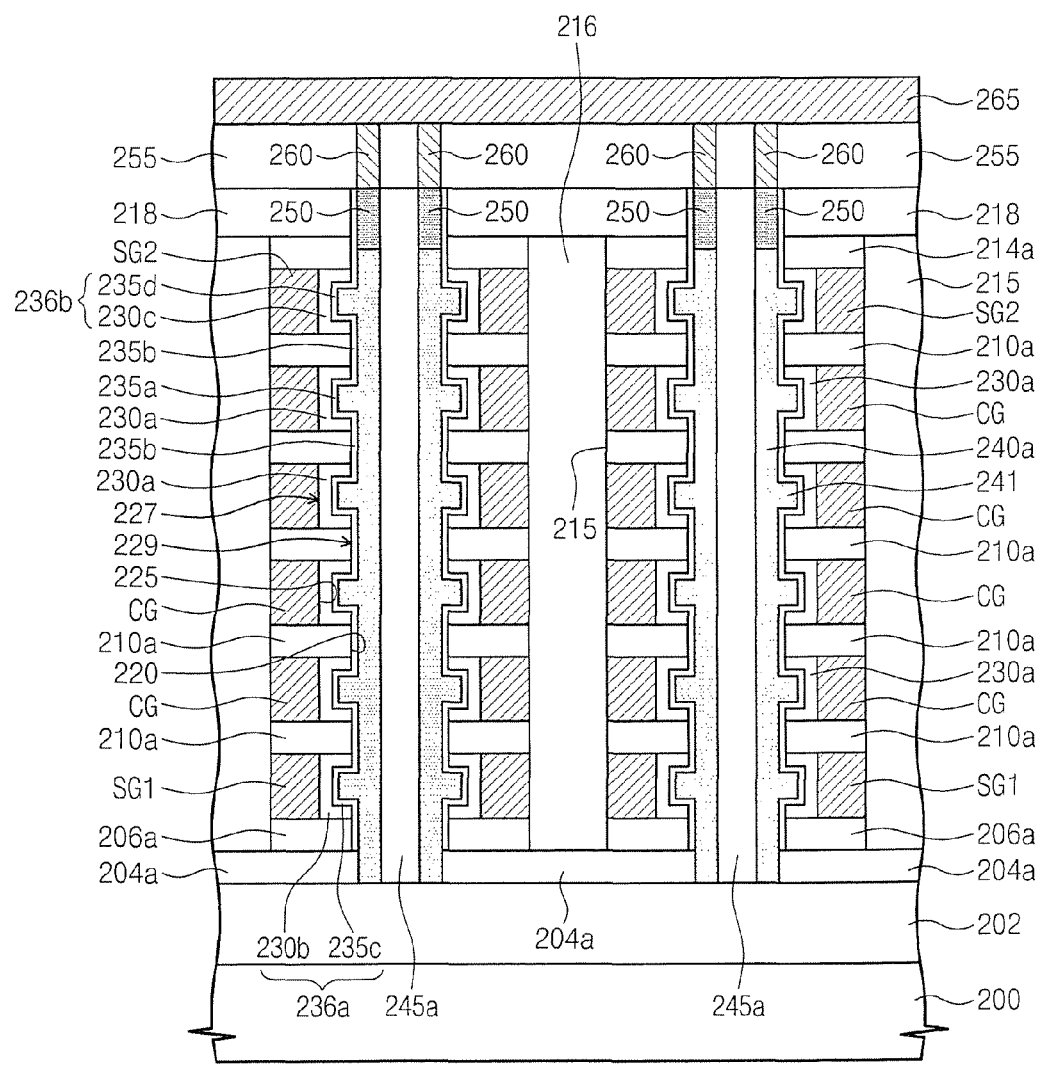
FIG. 6 is a cross section view taken along the line IV-IV' of FIG. 5.

FIG. 5 is a top plan view of a nonvolatile memory device according to further embodiments of the present invention and FIG. 6 is a cross section view taken along the line IV-IV' of FIG. 5.

Referring to FIGS. 5 and 6, a semiconductor substrate 200 (hereinafter it is referred to as 'substrate') includes a memory cell region 50 and a connection region 60 disposed to be adjacent to the memory cell region 50. The substrate 200 includes a peripheral region (not shown) having peripheral circuits. A well region 202 doped with dopants of a first conductivity type is disposed in the substrate 200 of the memory cell region 50. The well region 202 can extend in the substrate 200 of the connection region 60.

Device isolation patterns 216 on the substrate 200 extend in parallel along a first direction. The device isolation patterns 216 are separated from each other in a second direction perpendicular to the first direction. The first direction corresponds to an x axis direction of FIG. 5 and the second direction corresponds to a y axis direction of FIG. 5. The device isolation pattern 216 may be formed of an oxide, a nitride and/or an oxynitirde.

A pair of gate stacks 300 is disposed on the substrate 200 between a pair of adjacent device isolation patterns 216. The pair of gate stacks 300 extends in parallel along the first direction (the x axis direction). The pair of gate stacks 300 is separated from each other in the second direction (the y axis direction) with defining a groove 220. The groove 220 is a space between the pair of gate stacks 300 and extends along the first direction. The pair of gate stacks 300 is symmetrically disposed with respect to the groove 220. The pair of gate stacks 300 may be defined as one gate stack group. A plurality of gate stack groups may be arranged in the second direction on the substrate 200. The plurality of gate stack groups may be arranged in parallel. The device isolation pattern 216 may fill a trench 215 between a pair of adjacent gate stack groups.

The gate stack 300 includes a plurality of intergate insulating patterns 210*a* and a plurality of cell gate patterns CG that are alternately stacked. The gate stack 300 may further include a first select gate pattern SG1 and a second select gate pattern SG2. The first select gate pattern SG1 is disposed between the substrate 200 and the lowermost cell gate pattern CG among the cell gate patterns CG and the second select gate pattern SG2 is disposed on the uppermost cell gate pattern CG among the cell gate patterns CG. The lowermost intergate insulating pattern 210*a* among the intergate insulating patterns 210*a* is disposed between the first select gate pattern SG1 and the lowermost cell gate pattern CG and the uppermost intergate insulating pattern 210*a* among the intergate insulating patterns 210*a* is disposed between the second select gate pattern SG1 and the uppermost cell gate pattern CG. A base insulating pattern 206*a* is disposed between the first select gate pattern SG1 and the substrate 200. A capping insulating pattern 214*a* may be disposed on the second select gate pattern SG2. The gate patterns (SG1, CG. SG2) and the insulating patterns 206*a*. 210*a* and 214*a* have a line shape extending along the first direction.

Pads CPD extend in the connection region 60 from the gate patterns (SG1, CG, SG2) of the gate stack 300 respectively. The intergate insulating patterns 210*a* also extend in the connection region 60 to be disposed between the pads CPD. The pads CPD have a stair shape going in the first direction.

A first interlayer insulating layer 218 is disposed on the substrate 200. The first interlayer insulating layer 218 covers the gate stacks 300 and the device isolation pattern 216. The first interlayer insulating layer 218 also covers the pads CPD. The groove 220 extends upwardly to penetrate the first interlayer insulating layer 218. An inner sidewall of the groove 220 includes a sidewall of the first interlayer insulating layer 218, sidewalls of the gate patterns (SG1, CG, SG2), a sidewall of the capping insulating pattern 214*a*, sidewalls of the intergate insulating patterns 210*a* and a sidewall of the base insulating pattern 206*a*.

A common source region 204*a* doped with dopants of a second conductivity type is formed in the substrate 200 under the first select gate pattern SG1. The common source region 204*a* is formed in the well region 202 and a top surface of the common source region 204*a* may be coplanar with a top surface of the substrate 200. The common source region 204*a* may have a line shape extending in the first direction (the x axis direction). The common source region 204*a* extends below the device isolation pattern 216 to be directly connected to adjacent common source regions 204*a*. The common source regions 204*a* disposed under the pair of gate stacks 300 between the adjacent device isolation patterns 216 respectively may be separated from each other. Unlike this, according to some embodiments of the present invention, the common source regions 204*a* in the memory cell region 50 extend to be directly connected to each other.

A pair of active patterns 240*a* adjacent to the pair of gate stacks 300 is disposed in the groove 220. The active pattern 240*a* upwardly extends from the substrate 200 along a sidewall of the gate stack 300. The pair of active patterns 240*a* may be separated from each other in the second direction. Lower portions of the pair of active patterns 240*a* may also be separated from each other. Alternatively, lower portions of the pair of active patterns 240*a* may extend and be connected to each other. A filling insulating pattern 245*a* may be disposed between the pair of gate stacks 300. The filling insulating pattern 245*a* may be formed of material having an etching selectivity with respect to the active patterns 240*a*. The pair of active patterns 240*a* is included in a pair of vertical cell strings respectively. The pair of active patterns 240*a* is defined as one active pattern group. A plurality of active pattern groups in the groove 200 is arranged along the first direction and the active pattern groups are separated from each other.

The active pattern 240*a* is in contact with the common source region 204*a*. The active pattern 240*a* may also be in contact with the well region 202. A common drain region 250 doped with dopants of the second conductivity type is formed in an upper portion of the active pattern 240*a*. A bottom surface of the common drain region 250 may have a height adjacent to a top surface of the second select gate pattern SG2.

Multilayer insulating patterns 230*a* are disposed between the cell gate patterns CG and the adjacent active pattern 240*a* respectively. As the multilayer insulating pattern 130*a* of the embodiments described above, the multilayer insulating pattern 230*a* includes a charge storage pattern, and a blocking insulating pattern disposed between the charge storage pattern and the cell gate pattern CG. The charge storage pattern and the blocking insulating pattern of the multilayer insulating pattern 230*a* may be formed of the same material as the charge storage pattern 131 and the blocking insulating pattern 132 of the embodiments described above. The charge storage patterns are separated from each other. The blocking insulating patterns are also separated from each other. Thus, a plurality of multilayer insulating patterns 230*a* adjacent to the active pattern 240*a* is separated from each other. More specifically, sidewalls of the cell gate patterns CG are recessed laterally compared with sidewalls 229 of the intergate insulating patterns 210*a* to define undercut regions 235 and the multilayer insulating patterns 230*a* are disposed in the undercut regions 235 respectively.

Tunnel insulating patterns 235*a* are disposed between the multilayer insulating patterns 230*a* and the active pattern 240a respectively. More specifically, the tunnel insulating patterns 235a are disposed between the charge storage patterns of the multilayer insulating patterns 230a and the active pattern 240a respectively. The tunnel insulating patterns 235a extend upwardly and/or downwardly and are directly connected to each other. That is, a successive tunnel insulating layer is disposed between a plurality of multilayer insulating patterns 230a and the active pattern 240a. An extended portion 235b of the tunnel insulating pattern 235a is disposed between the sidewall 229 of the intergate insulating pattern 210a and the active pattern 240a. The tunnel insulating pattern 235a may be formed of the same material as the tunnel insulating pattern 135a of the embodiments described above. The active pattern 240a may include a protrusion 241 extending in the undercut region 235.

A first gate insulating layer 236a is disposed between the first select gate pattern SG1 and the active pattern 240a. The first gate insulating layer 236a may include a first pattern 230b and a second pattern 235c. The first pattern 230b may be formed of the same material as the multilayer insulating pattern 230a. The first pattern 230b may be separated from the adjacent multilayer insulating pattern 230a. For example, the sidewall of the first select gate pattern SG1 is recessed laterally compared with the sidewall 229 of the intergate insulating pattern 210a so that an undercut region 235 is defined. The first pattern 230b may be disposed in the undercut region beside the first select gate pattern SG1. The second pattern 235c of the first gate insulating layer 236a extends upwardly and is directly connected to the extended portion 235b of the tunnel insulating pattern 235a. A second gate insulating layer 236b is disposed between the second select gate pattern SG2 and the active pattern 240a. The second gate insulating layer 236b may include a first pattern 230c formed of the same material as the multilayer insulating pattern 230a and a second pattern 235d formed of the same material as the tunnel insulating pattern 235a. The first pattern 230c of the second gate insulating layer 236b may be disposed in the undercut region 235 and be separated from the adjacent multilayer insulating pattern 230a. The second pattern 235d of the second gate insulating layer 236b may extend downwardly and be directly connected to the extended portion 235b of the tunnel insulating pattern 235a.

A second interlayer insulating layer 255 is disposed on a surface of the substrate 200. The second interlayer insulating layer 255 can fill the groove 220 disposed between the active pattern groups. A bit line plug 260 is connected to the common drain region through penetrating the second interlayer insulating layer 255 of the memory cell region 50. Connection plugs 262 are connected to the pads CPD through penetrating the second and first interlayer insulating layers 255 and 218 consecutively.

A bit line 265 connected to the bit line plug 260 is disposed on the second interlayer insulating layer 255. The bit line 265 extends in the second direction (the y axis direction). The bit line 265 is connected to a plurality of common drain regions 250 arranged in the second direction. A plurality of bit lines 265 is arranged in parallel on the second interlayer insulating layer 255. Interconnection lines (not shown) connected to the connection plugs 262 respectively may be disposed on the second interlayer insulating layer 255 of the connection region 60.

FIGS. 7A through 7D are cross section views taken along the line IV-IV' of FIG. 5 illustrating operations for forming a nonvolatile memory device according to further embodiments of the present invention.

Figure 7A:
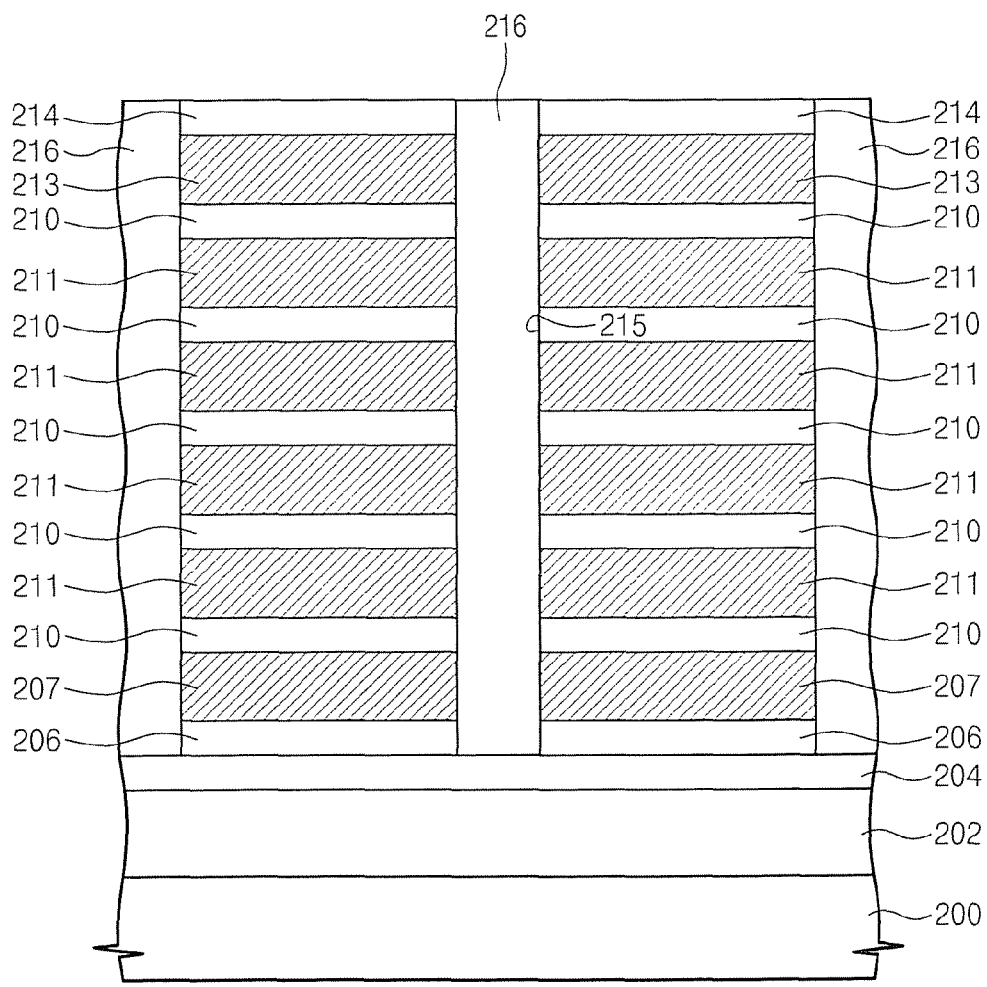
FIGS. 7A through 7D are cross section views taken along the line IV-IV' of FIG. 5 illustrating operations for forming a nonvolatile memory device according to further embodiments of the present invention.

Referring to FIGS. 5 and 7A, a well region 202 doped with dopants of a first conductivity type is formed in a substrate 200 and a common source region 204 is formed by counter doping the well region 202 with dopants of a second conductivity type.

A base insulating layer and a first select gate conductive layer are sequentially formed on the substrate 200. A plurality of intergate insulating layers and a plurality of cell gate conductive layers are alternately stacked on the first select gate conductive layer. A second select gate conductive layer and a capping insulating layer are sequentially stacked on the uppermost intergate insulating layer. The capping insulating layer, the second select gate conductive layer, the intergate insulating layers, the cell gate conductive layers, the first select gate conductive layer and the base insulating layer are consecutively patterned to form preliminary gate stacks. The preliminary gate stack includes a preliminary base insulating pattern 206, a preliminary first select gate pattern 207, preliminary intergate insulating patterns 210, preliminary cell gate patterns 211, a preliminary second select gate pattern 213 and a preliminary capping insulating pattern 214. The preliminary intergate insulating patterns 210 and the preliminary cell gate patterns 211 are alternately stacked. The preliminary gate stack is formed on the substrate 200 of the memory cell region 50 and on the substrate 200 of the connection region 60.

A device isolation layer filling a trench 215 is formed on the substrate 200. The device isolation layer is planarized until the preliminary capping insulating pattern 214 is exposed so that a device isolation pattern 216 is formed. A preliminary gate stack of the connection region 60 is formed in a stair shape to form preliminary pads (not shown). Operations for forming the preliminary pads may be performed using the same method as the method of forming the pads CPD described referring to FIGS. 4A through 4C.

Figure 7B:
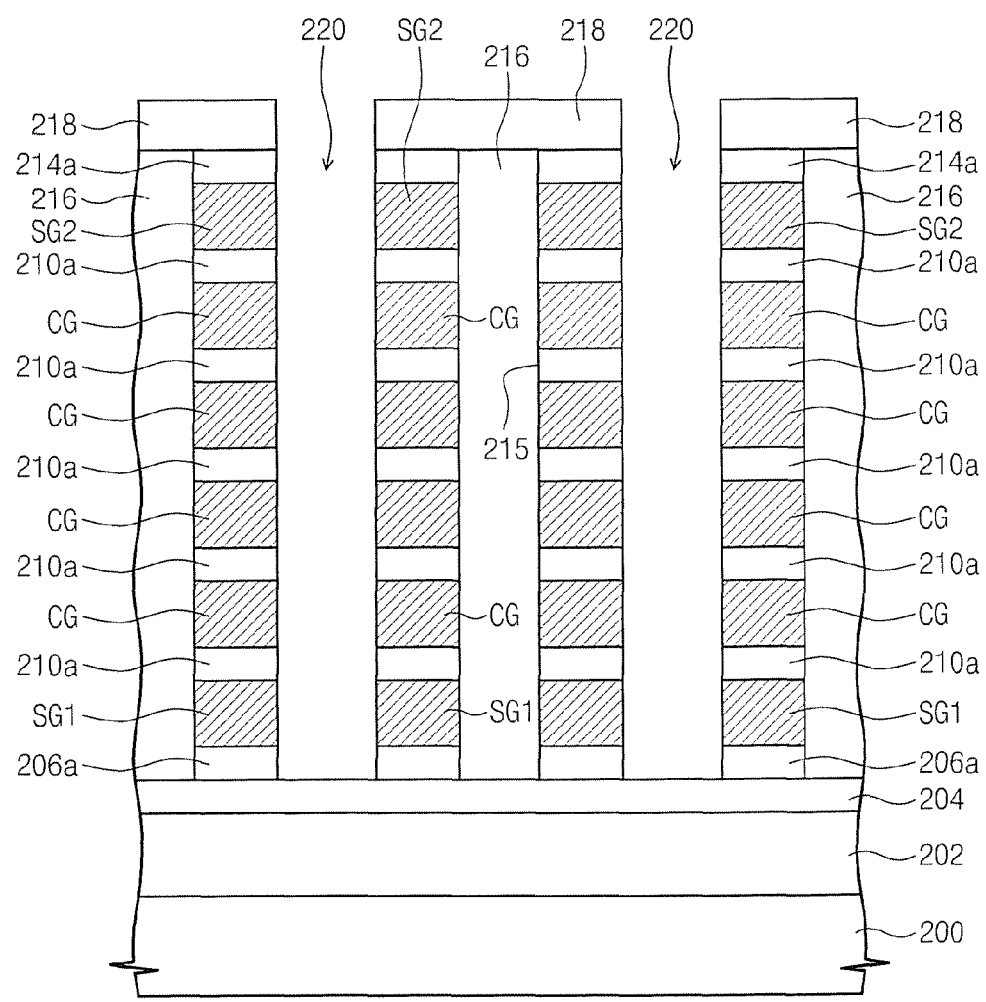

Referring to FIG. 7B, a first interlayer insulating layer 218 is formed on the substrate 200 including the device isolation pattern 216. The first interlayer insulating layer 218 is also formed on the preliminary pads. A groove 220 exposing the common source region 204 is formed by patterning the first interlayer insulating layer 218 and the preliminary gate stack consecutively patterned. Thus, the preliminary gate stack is divided into a pair of gate stacks. Also, the preliminary pads are divided into pads connected to each of the gate stacks. The gate stack includes a base insulating pattern 206a, a first select gate pattern SG1, intergate insulating patterns 210a, cell gate patterns CG, a second select gate pattern SG2 and a capping insulating pattern 214a.

Figure 7C:
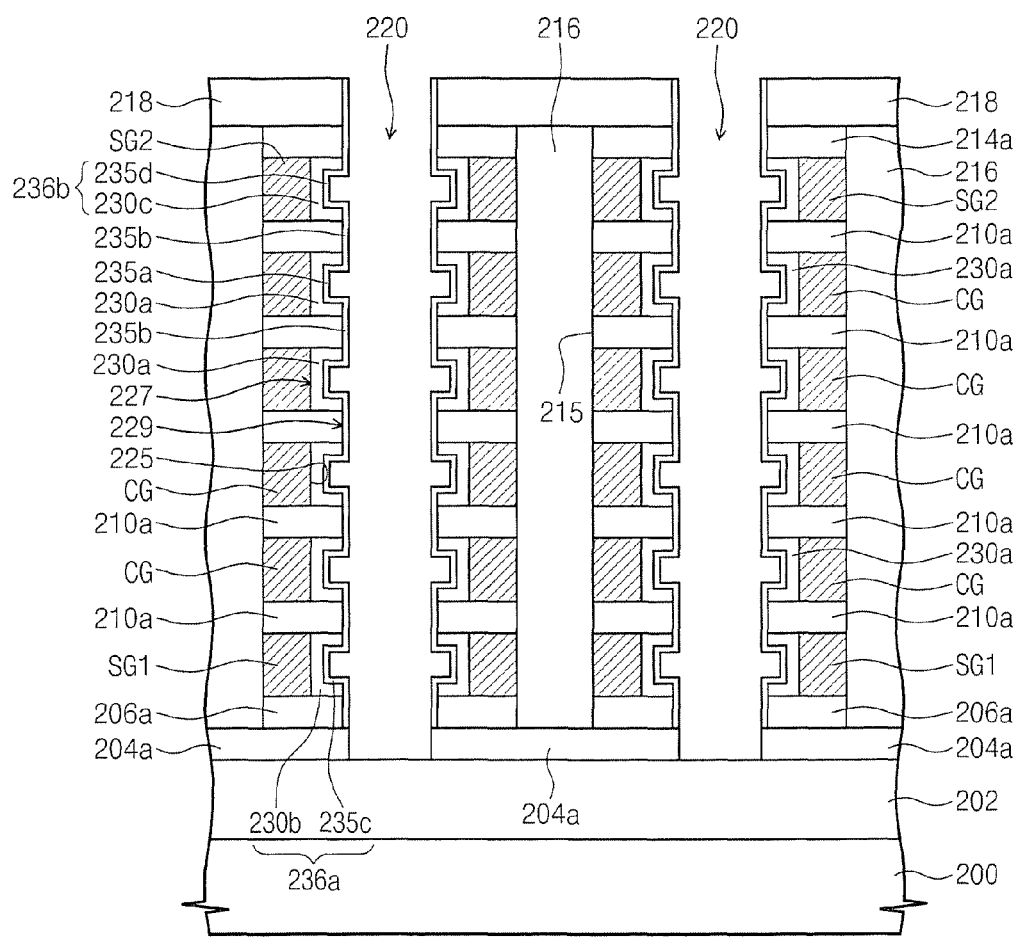

Referring to FIG. 7C, the gate patterns (SG1, CG, SG2) exposed to the groove 220 are more recessed laterally compared with the intergate insulating patterns 210a to define undercut regions 235. The undercut region 235 may be defined by a sidewall 237 of the cell gate pattern CG and end portions of the intergate insulating patterns 210a disposed on and under the cell gate pattern CG. A multi-layered insulating layer is formed on the substrate 200 including the undercut regions 235. The multi-layered insulating layer includes a blocking insulating layer and a charge storage layer. The multi-layered insulating layer outside of the undercut regions 235 is removed to form multilayer insulating patterns 230a and first patterns 230b and 230c that are disposed in the undercut regions 235 and separated from each other. The multi-layered insulating layer outside of the undercut regions 235 can be removed by an anisotropic etching process or an isotropic etching process using a sacrificial pattern as described above.

A tunnel insulating layer is formed on the substrate 200 including the multilayer insulating patterns 230a. The tunnel insulating layer may be formed by an atomic layer deposition (ALD) process. The tunnel insulating layer may be formed of an oxide layer, a nitride layer and/or an oxynitride layer. The tunnel insulating layer formed in the undercut region beside the cell gate pattern CG corresponds to a tunnel insulating pattern 235a and the tunnel insulating layer disposed on a sidewall 229 of the intergate insulating pattern 210a corresponds to an extended portion 235b. The tunnel insulating layer formed in the undercut regions 235 beside the select gate patterns (SG1, SG2) corresponds to second patterns 235c and 235d.

The common source region 204 may be exposed by removing the tunnel insulating layer disposed on a bottom surface of the groove 220. Subsequently, the well region 202 may be exposed by etching the exposed common source region 204. A common source region 204a etched in the shape of the groove 220 may be formed in a line shape extending in a specific direction (the x axis direction of FIG. 1).

Figure 7D:
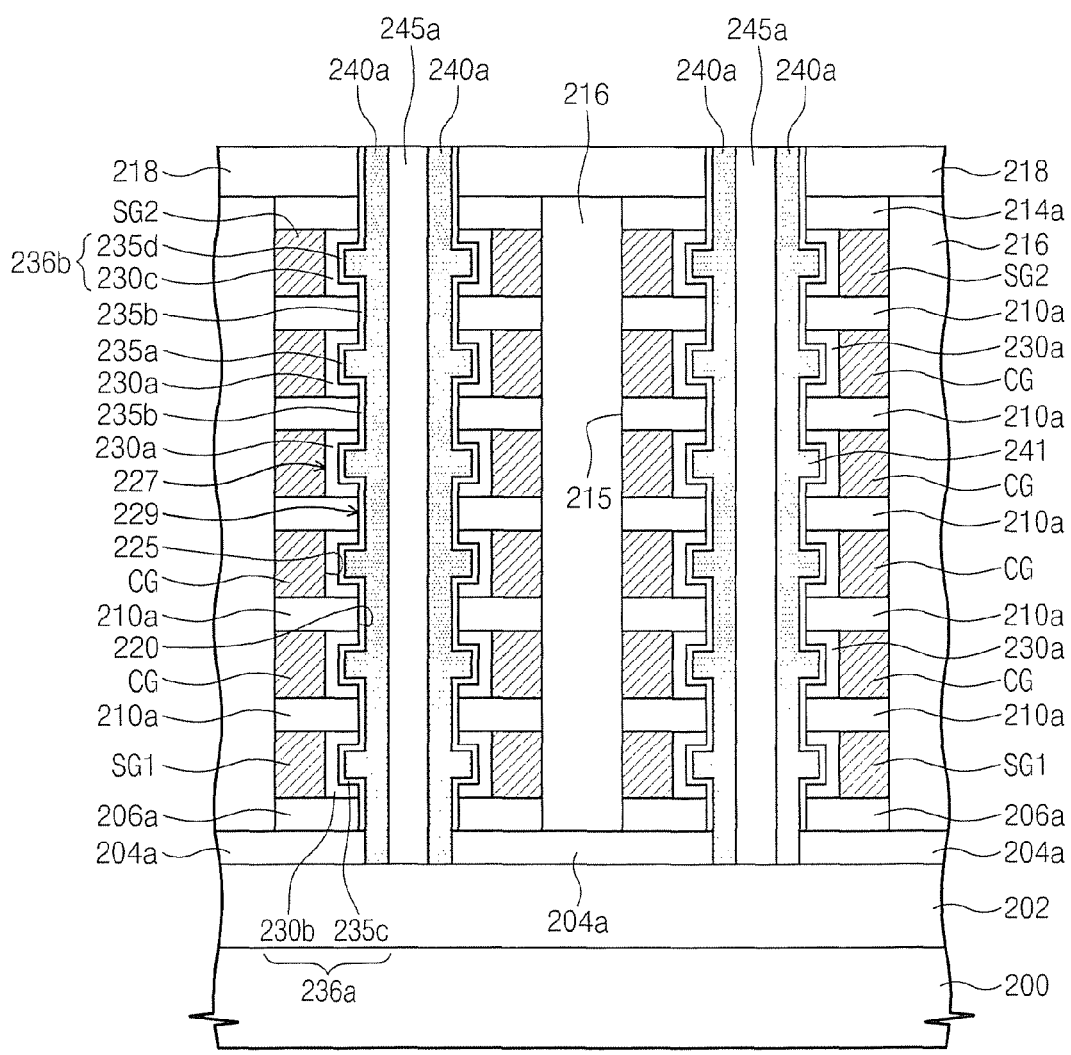

Referring to FIG. 7D, a pair of active patterns 240a which is adjacent to sidewalls of a pair of gate stacks and is separated from each other is formed in the groove 220. A filling insulating pattern 245a is formed between the pair of active patterns 240a. As depicted in FIG. 7D, lower portions of the pair of active patterns 240a may be separated from each other. Unlike this, the lower portions of the pair of active patterns 240a may extend to be connected to each other. The pair of active patterns 240a may be in contact with the common source region 204a and the well region 202. Operations for forming the pair of active patterns 240a will be described in detail referring to top plan views of FIGS. 8A through 8C.

Figure 8A:
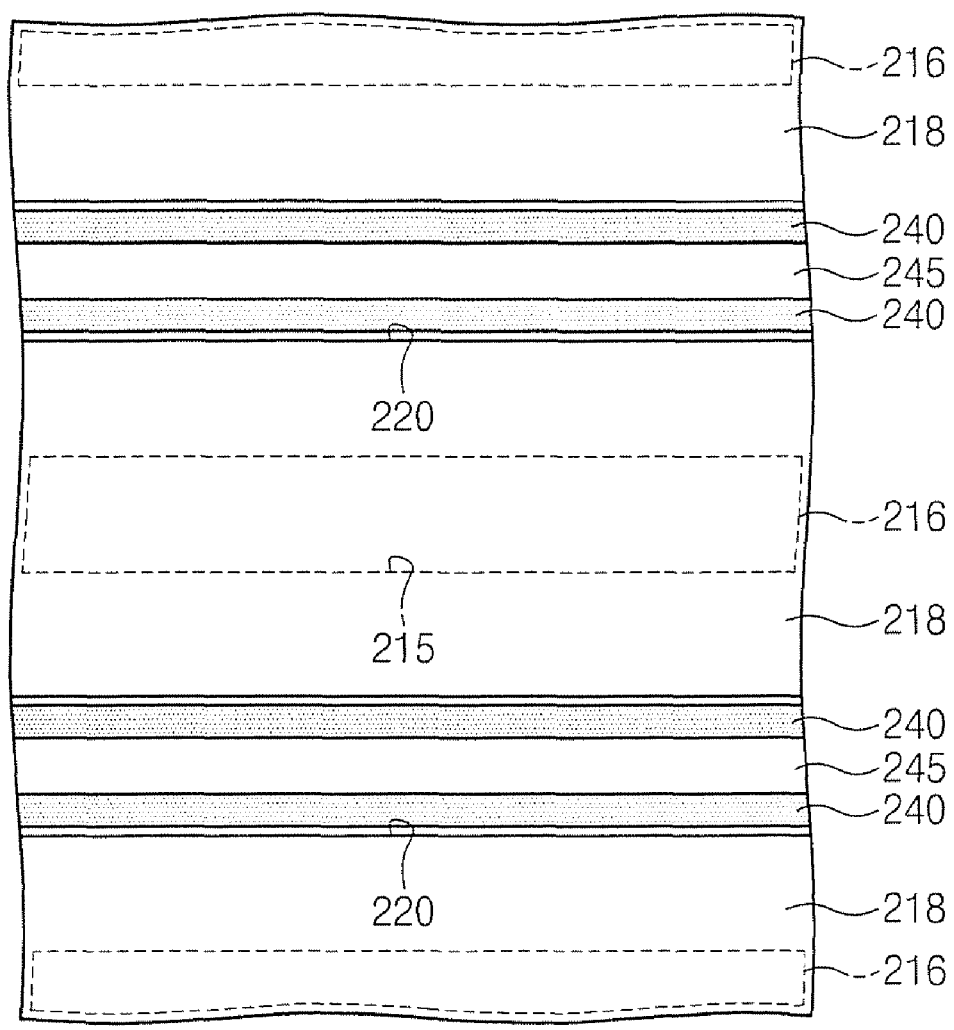
FIGS. 8A through 8C are top plan views illustrating operations for forming an active pattern of FIG. 7D.
Figure 8B:
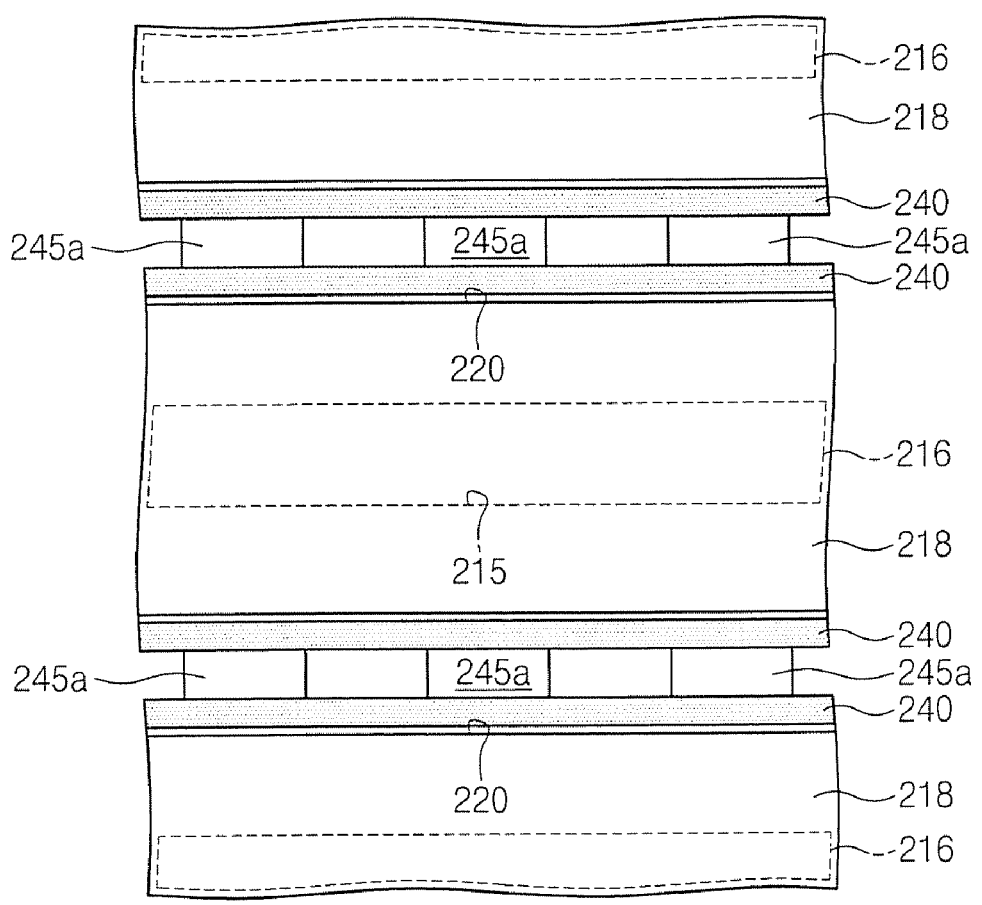
Figure 8C:
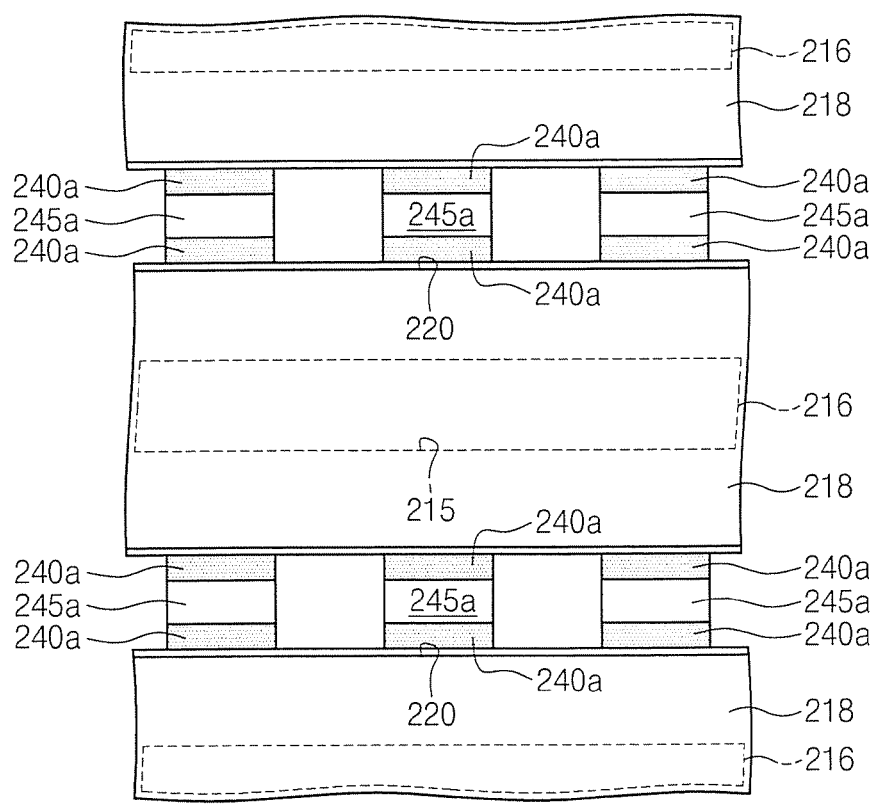

FIGS. 8A through 8C are top plan views illustrating operations for forming an active pattern of FIG. 7D.

Referring to FIGS. 7D and 8A, an active layer is formed on the substrate 200 including the tunnel insulating pattern 235a. The active layer may fill the undercut region 235. A portion of groove 220 may be vacant. The active layer on a bottom surface of the groove 220 and the first interlayer insulating layer 218 can be removed by an anisotropic etching process. Thus, preliminary active patterns 240 may be formed on both inner sidewalls of the groove 220. The preliminary active patterns 240 may extend in parallel to the gate patterns (SG1, CG, SG2). A filling insulating layer filling the groove 220 may be formed on the substrate 200 including the preliminary active patterns 240. The filling insulating layer outside the groove 220 may be removed so that the preliminary active pattern 240 is exposed. Thus, a preliminary filling insulating pattern 245 may be formed in the groove 220.

The preliminary active pattern 240 and the preliminary filling insulating pattern 245 may be formed by another method. More specifically, after sequentially forming the active layer and the filling insulating layer, the active layer and the filling insulating layer may be planarized until the first interlayer insulating layer 218 is exposed so that the preliminary active pattern 240 and the preliminary filling insulating pattern 245 may be formed. In this case, lower portions of the preliminary active pattern are exposed and connected to each other.

Referring to FIG. 8B, the preliminary filling insulating pattern 245 is patterned to form filling insulating patterns 245a that are separated from each other in the groove 220. The preliminary active pattern 240 between the filling insulating patterns 245a is exposed.

Referring to FIG. 8C, the preliminary active pattern 240 between the filling insulating patterns 245a is removed using the filling insulating patterns 245a as a mask. As a result, active patterns 240a are formed in the groove 220. The preliminary active pattern 240 between the filling insulating patterns 245a may be removed by an isotropic etching process (e.g., a wet etching process).

The active patterns 240a may be formed by another method. More specifically, after forming the active layer, a patterning process including a photolithography process and an anisotropic etching process may be performed on the active layer to form the active patterns 240a. In this case, the filling insulating patterns 245a may be omitted.

Subsequent processes are described referring to FIG. 6. Dopants of a second conductivity type are supplied into an upper portion of the active pattern 240a to form a common drain region 250. A second interlayer insulating layer 255 is formed on a surface of the substrate 200. The second interlayer insulating layer 255 may fill the groove 220 between the filling insulating patterns 245a. When the filling insulating pattern 245a is omitted, the second interlayer insulating layer 255 can also fill a pair of active patterns 240a facing each other.

A bit line plug 260 penetrating the second interlayer insulating layer 255 to be connected to the common drain region 250 is formed. Connection plugs (262 of FIG. 5) penetrating the second and first interlayer insulating layers 255 and 218 to be connected to pads (CPD of FIG. 5) are formed. The bit line plug 260 and the connection plugs 262 may be formed at the same time.

A bit line 265 connected to the bit line plug 260 and an interconnection line (not shown) connected to the connection plug 262 are formed on the second interlayer insulating layer 255. As a result, a nonvolatile memory device illustrated in FIGS. 5 and 6 can be formed.

Nonvolatile memory devices according to the embodiments described above may be implemented in various types of semiconductor packages. For example, nonvolatile memory devices according to some embodiments of the present invention can be packaged in ways such as PoP (package on package), ball grid array (BGA), chip scale package (CSP), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline (SOIC), shrink small outline package (SSOP), thin small outline (TSOP), thin quad flatpack (TQFP), system in package (SIP), multi chip package (MCP), wafer-level fabricated package (WFP), wafer-level processed stack package (WSP). A package including a nonvolatile memory device according to some embodiments of the present invention may further include a controller controlling the nonvolatile memory device and/or a logic device.

Figure 9:
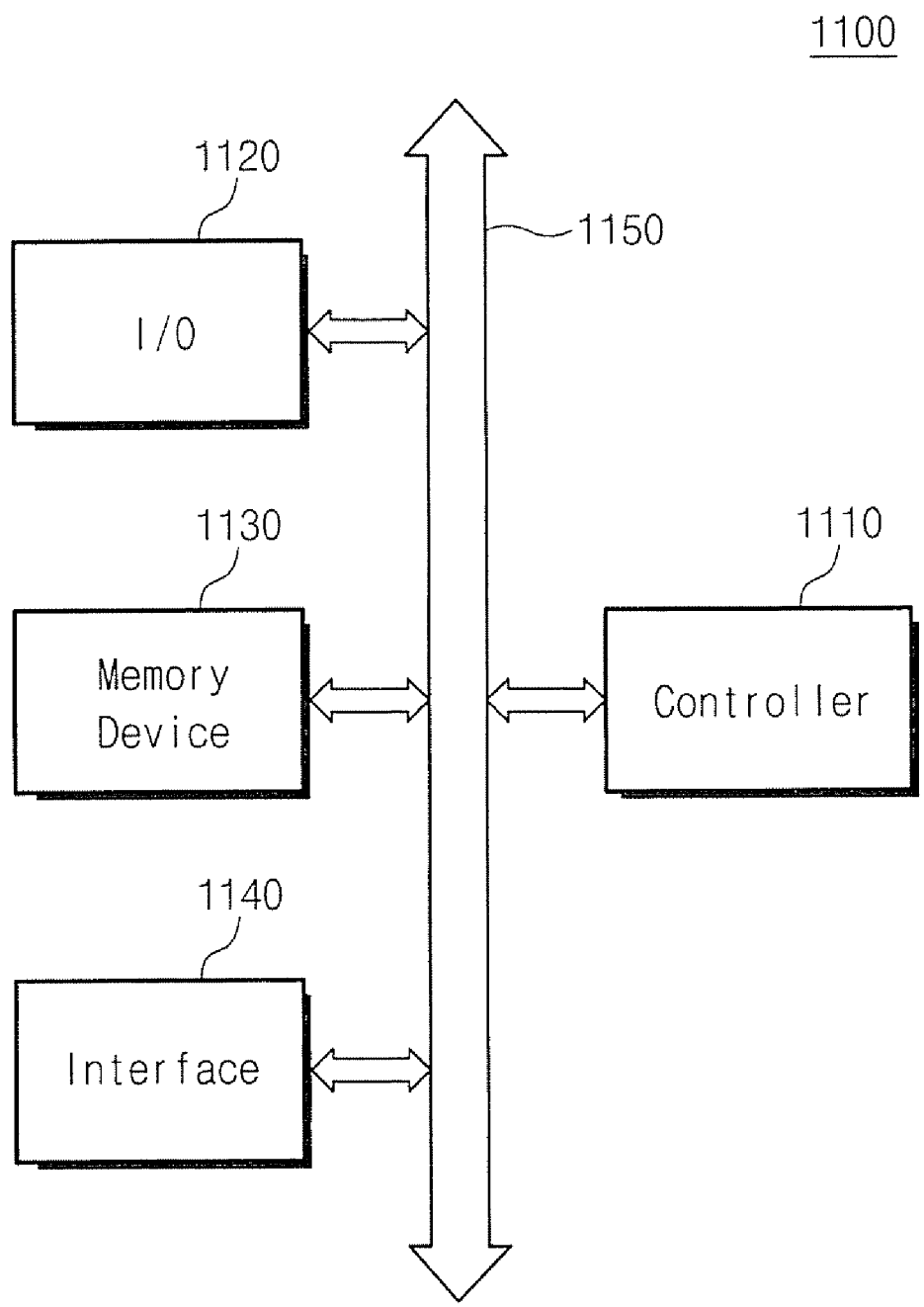
FIG. 9 is an electronic system including a nonvolatile memory device according to some embodiments of the present invention.

FIG. 9 is an electronic system including a nonvolatile memory device according to some embodiments of the present invention.

Referring to FIG. 9, an electronic system 1100 according to some embodiments of the present invention may include a controller 1110, an input/output device 1120, a memory device 1130, an interface 1140 and a bus 1150. The controller 1110, the input/output device 1120, the memory device 1130, and the interface 1140 may be coupled with each other through the bus 1150. The bus 1150 corresponds to a path through which data moves.

The controller 1110 may include at least one among a microprocessor, a digital signal process, a microcontroller and logic devices capable for performing a function similar to the microprocessor, the digital signal process and the microcontroller. The input/output device 1120 may include a keypad, a keyboard and a display device. The memory device 1130 can store data and/or a command. The memory device 1130 may include at least one among the nonvolatile memory devices according to the above-described embodiments. The memory device 1130 may further include at least one among different kinds of nonvolatile memory devices and volatile memory devices capable of a random access. The interface 1140 can transmit data to a communication network or receive data from a communication network. The interface 1140 may be a wire type or a wireless type. For example, the interface 1140 may include an antenna or a wire/wireless transceiver. Even though not depicted, the electronic system 1100 is an operation memory for improving an operation of the controller 1110 and may further include a high speed DRAM and/or a high speed SRAM.

The electronic system 1100 can be applied to a personal digital assistant (PDA), a portable computer, a web tablet, a wireless phone, a digital music player, a memory card or all the electronic devices capable of transmitting data and/or receiving data in a wireless environment.

Figure 10:
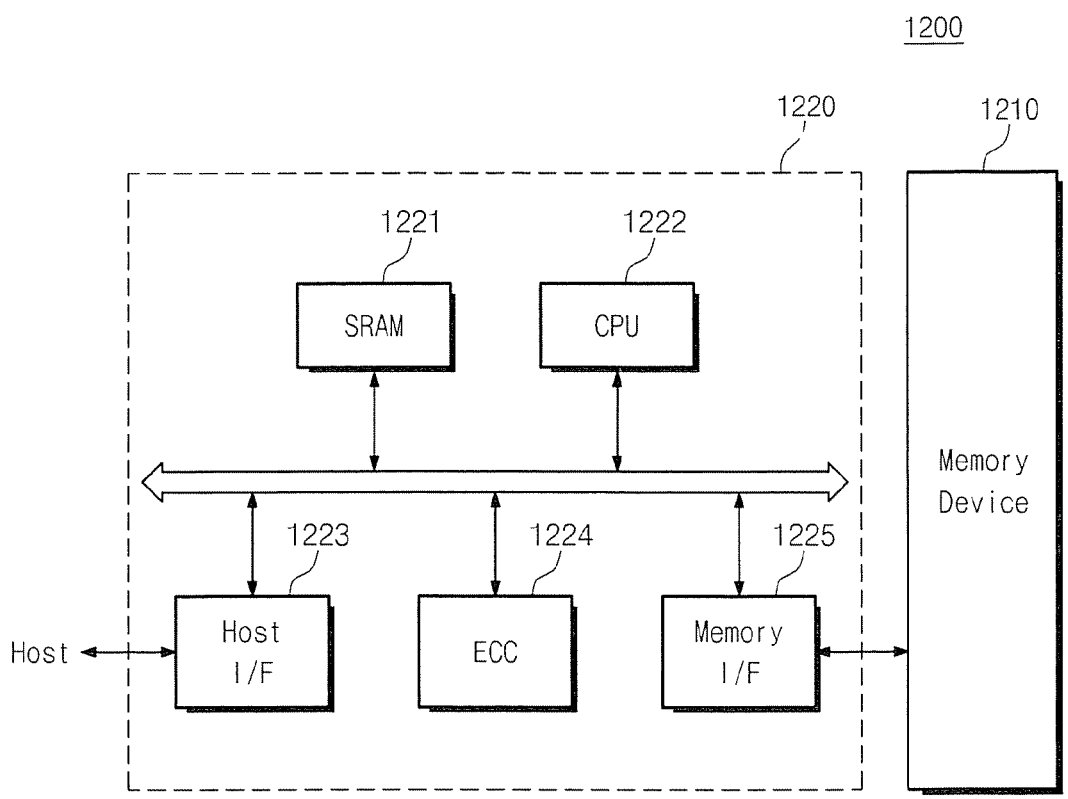
FIG. 10 is a block diagram of a memory card including a nonvolatile memory device according to some embodiments of the present invention.

FIG. 10 is a block diagram of a memory card including a nonvolatile memory device according to some embodiments of the present invention.

Referring to FIG. 10, a memory card 1200 according to some embodiments of the present invention is fitted with a memory device 1210. The memory card 1200 may include a memory controller 1220 controlling a data exchange between a host and the memory device 1210.

The memory controller 1220 may include a processing unit 1222 controlling a whole operation of the memory card 1200. The memory controller 1220 may also include a SRAM 1221 used as an operation memory of the processing unit 1222. The memory controller 1220 may further include a host interface 1223 and a memory interface 1225. The host interface 1223 may include a data exchange protocol between the memory card 1200 and the host. The memory interface 1225 may connect the memory controller 1220 to the memory device 1210. The memory controller 1220 may further include an error correction block 1224. The error correction block 1224 can detect an error of data readout from the memory device 1210, and then correct the error. The memory card 1200 may further include a ROM device (not shown) storing code data for interfacing with the host. The memory card 1200 may be used as a portable data storage card. Alternatively, the memory card 1200 can be included in a solid state disk (SSD) capable of substituting a hard disk of a computer system.

As described above, according to some embodiments of the present invention, the charge storage patterns are separated from each other. Thus, charges stored in the charge storage pattern can be prevented from moving upwardly and/or downwardly. As a result, reliability of a nonvolatile memory cell can be improved. Also, the tunnel insulating patterns extend to be directly connected to each other. Thus, the tunnel insulating patterns are not exposed to an etching process for a separation. As a result, a degradation of reliability of the tunnel insulating patterns can be minimized.

Although a few embodiments of the present general inventive concept have been shown and described, it will be appreciated by those skilled in the art that changes may be made in these embodiments without departing from the principles and spirit of the general inventive concept, the scope of which is defined in the appended claims and their equivalents. Therefore, the above-disclosed subject matter is to be considered illustrative, and not restrictive.

What is claimed is:

1. A nonvolatile memory device comprising:
a plurality of intergate insulating patterns and a plurality of cell gate patterns that are alternately and vertically stacked on a substrate;
an active pattern disposed on the substrate, the active pattern extending upwardly along sidewalls of the intergate insulating patterns and the cell gate patterns;
a plurality of charge storage patterns disposed between the plurality of cell gate patterns and the active pattern, respectively, the plurality of the charge storage patterns being separated from each other;
tunnel insulating patterns disposed between the plurality of cell gate patterns and the active pattern, respectively, and the tunnel insulating patterns extending to be directly connected to each other; and
a plurality of blocking insulating patterns disposed between the plurality of cell gate patterns and the plurality of charge storage patterns, respectively.

2. The nonvolatile memory device of claim 1, wherein a sidewall of the cell gate pattern is recessed laterally so that an undercut region is defined and the charge storage pattern is disposed in the undercut region.

3. The nonvolatile memory device of claim 2, wherein the tunnel insulating pattern is disposed in the undercut region, and
wherein the extended portion of the tunnel insulating pattern is disposed between a sidewall of the intergate insulating pattern and the active pattern.

4. The nonvolatile memory device of claim 2, wherein the active pattern comprises a protrusion extending in the undercut region.

5. The nonvolatile memory device of claim 2, wherein the blocking insulating patterns are separated from each other.

6. The nonvolatile memory device of claim 1, further comprising:
a first select gate pattern disposed between the substrate and a lowermost cell gate pattern among the cell gate patterns;
a first gate insulating layer disposed between the first select gate pattern and the active pattern;
a second select gate pattern disposed on an uppermost cell gate pattern among the cell gate patterns and extending in a first direction;
a second gate insulating layer disposed between the second select gate pattern and the active pattern; and
a bit line disposed on a top surface of the second select gate pattern and extending a second direction perpendicular to the first direction.

7. The nonvolatile memory device of claim 6, further comprising:
a well region disposed in the substrate and doped with dopants of a first conductivity type;
a common source region disposed in the well region and doped with dopants of a second conductivity type; and
a common drain region formed in an uppermost portion of the active pattern and doped with dopants of the second conductivity type, wherein the active pattern is in contact with the common source region and the bit line is electrically connected to the common drain region.

8. The nonvolatile memory device of claim 7, wherein the active pattern is in contact with the well region.

9. The nonvolatile memory device of claim 1, wherein the active pattern is disposed in a hole penetrating the cell gate patterns and the intergate insulating patterns, and sidewalls of the cell gate patterns and the intergate insulating patterns constitute a sidewall of the hole.

10. The nonvolatile memory device of claim 1, wherein the intergate insulating patterns and the cell gate patterns have a line shape extending along a specific direction parallel to a top surface of the substrate.

* * * * *